(12) United States Patent
Bayless et al.

(10) Patent No.: US 11,646,269 B2
(45) Date of Patent: May 9, 2023

(54) RECESSED SEMICONDUCTOR DEVICES, AND ASSOCIATED SYSTEMS AND METHODS

(71) Applicant: Micron Technology, Inc., Boise, ID (US)

(72) Inventors: Andrew M. Bayless, Boise, ID (US); Brandon P. Wirz, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 93 days.

(21) Appl. No.: 17/243,411

(22) Filed: Apr. 28, 2021

(65) Prior Publication Data

US 2022/0352077 A1 Nov. 3, 2022

(51) Int. Cl.
| | |
|---|---|
| *H01L 23/538* | (2006.01) |
| *H01L 25/065* | (2023.01) |
| *H01L 21/768* | (2006.01) |
| *H01L 23/532* | (2006.01) |

(52) U.S. Cl.
CPC .... *H01L 23/5384* (2013.01); *H01L 21/76802* (2013.01); *H01L 21/76877* (2013.01); *H01L 23/5381* (2013.01); *H01L 23/5386* (2013.01); *H01L 23/53228* (2013.01); *H01L 25/0657* (2013.01)

(58) Field of Classification Search
CPC .......... H01L 23/5384; H01L 21/76802; H01L 21/76877; H01L 23/53228; H01L 23/5381; H01L 23/5386; H01L 25/0657
See application file for complete search history.

(56) References Cited

U.S. PATENT DOCUMENTS

| | | | | |
|---|---|---|---|---|
| 6,727,116 | B2 * | 4/2004 | Poo | H01L 25/105 438/678 |
| 7,585,750 | B2 * | 9/2009 | Do | H01L 24/24 257/E21.211 |
| 7,605,457 | B2 * | 10/2009 | Hoshino | H01L 25/50 257/777 |
| 7,863,722 | B2 * | 1/2011 | Chua | H01L 21/561 438/109 |
| 2003/0232488 | A1 * | 12/2003 | Chua | H01L 21/76898 257/E21.597 |

(Continued)

*Primary Examiner* — Bac H Au
(74) *Attorney, Agent, or Firm* — Perkins Coie LLP

(57) ABSTRACT

Semiconductor devices having recessed edges with plated structures, semiconductor assemblies formed therefrom, and associated systems and methods are disclosed herein. In one embodiment, a semiconductor assembly includes a first semiconductor device and a second semiconductor device. The first semiconductor device can include an upper surface and a first dielectric layer over the upper surface, the second semiconductor device can include a lower surface and a second dielectric layer over the lower surface, and the first and second dielectric layers can be bonded to couple the first and second semiconductor devices. The first and second dielectric layers can each include a plurality of inwardly extending recesses exposing a plurality of metal structures on the respective upper and lower surfaces, and the upper surface recesses and metal structures can correspond to the lower surface recesses and metal structures. The metal structures can be electrically coupled by plated structures positioned in the recesses.

22 Claims, 15 Drawing Sheets

(56) References Cited

U.S. PATENT DOCUMENTS

| | | | | |
|---|---|---|---|---|
| 2004/0207049 A1* | 10/2004 | Bauer | ................ | H01L 23/3185 |
| | | | | 438/113 |
| 2009/0032960 A1* | 2/2009 | Pratt | ................ | H01L 25/50 |
| | | | | 438/618 |
| 2010/0270668 A1* | 10/2010 | Marcoux | ................ | H01L 25/0657 |
| | | | | 257/E21.546 |
| 2013/0037939 A1* | 2/2013 | Lee | ................ | H01L 23/3171 |
| | | | | 257/737 |
| 2013/0341803 A1* | 12/2013 | Cheah | ................ | H01L 24/16 |
| | | | | 257/774 |
| 2015/0200163 A1* | 7/2015 | Lin | ................ | H01L 23/5384 |
| | | | | 257/621 |
| 2021/0159178 A1* | 5/2021 | Nam | ................ | H01L 23/373 |
| 2021/0193622 A1* | 6/2021 | Choi | ................ | H01L 23/5384 |
| 2021/0280563 A1* | 9/2021 | Wu | ................ | H01L 25/50 |
| 2021/0398929 A1* | 12/2021 | Kim | ................ | H01L 23/3157 |
| 2022/0157740 A1* | 5/2022 | Verhaverbeke | ................ | H01L 24/96 |
| 2022/0181299 A1* | 6/2022 | Kim | ................ | H01L 29/0684 |
| 2022/0208682 A1* | 6/2022 | Son | ................ | H01L 23/5384 |
| 2022/0301890 A1* | 9/2022 | Chen | ................ | H01L 23/5386 |
| 2022/0302082 A1* | 9/2022 | Liang | ................ | H01L 24/18 |
| 2022/0320045 A1* | 10/2022 | Chang | ................ | H01L 25/105 |
| 2022/0344270 A1* | 10/2022 | Sheng | ................ | H01L 23/5386 |

* cited by examiner

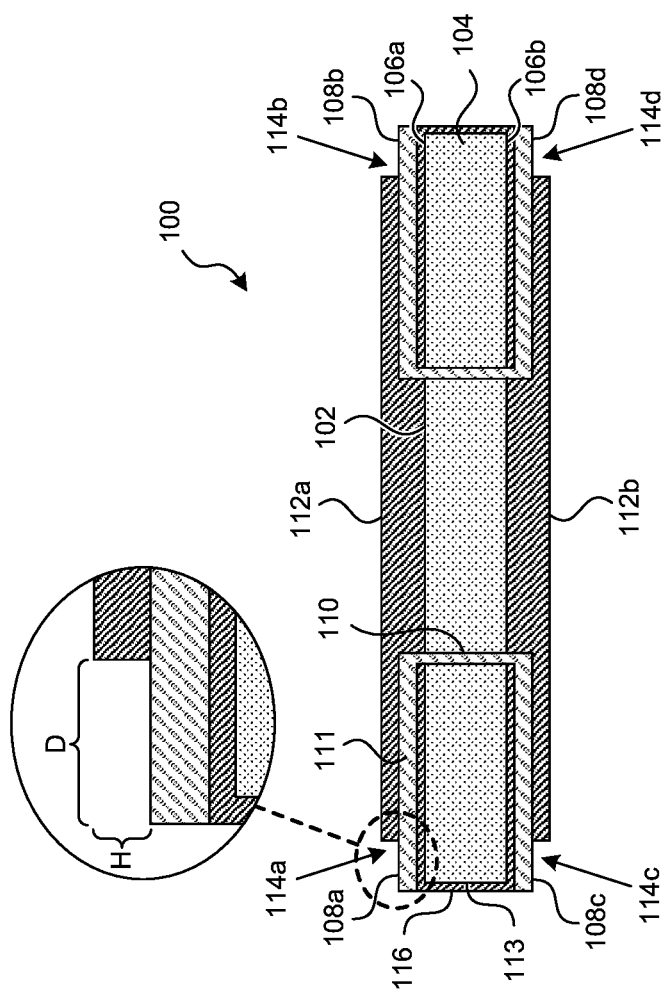
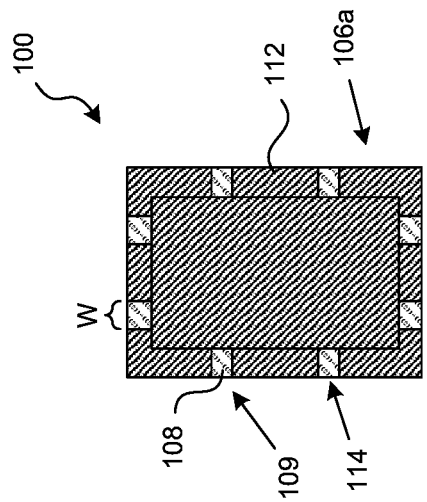
FIG. 1A
FIG. 1B

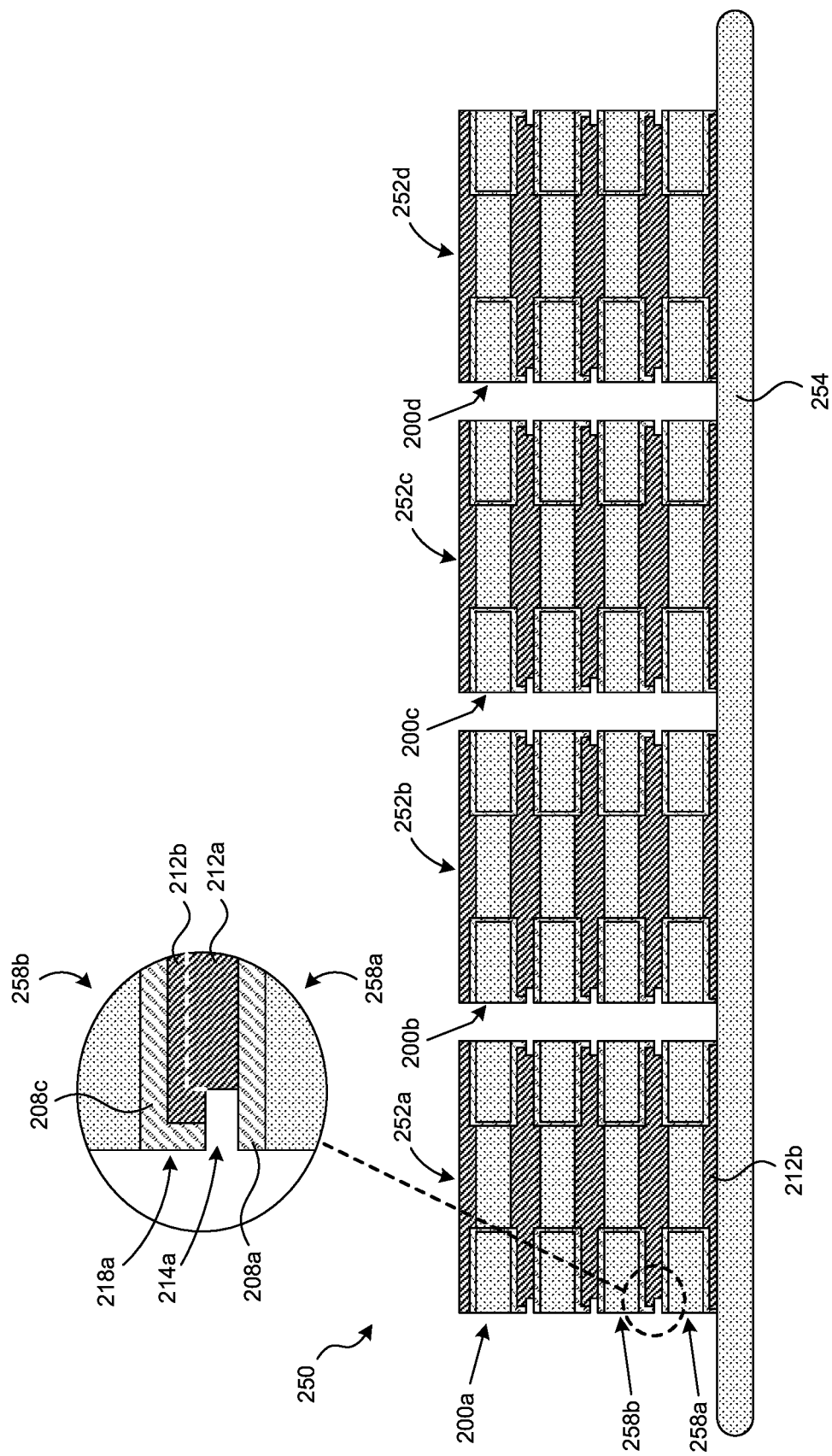

RECESSED SEMICONDUCTOR DEVICES, AND ASSOCIATED SYSTEMS AND METHODS

TECHNICAL FIELD

The present technology generally relates to semiconductor devices, and more particularly relates to semiconductor devices having recessed edges with plated structures located therein.

BACKGROUND

Packaged semiconductor dies, including memory chips, microprocessor chips, and imager chips, typically include a semiconductor die mounted on a substrate and encased in a protective covering. The semiconductor die can include functional features, such as memory cells, processor circuits, and imager devices, as well as bond pads electrically connected to the functional features. The bond pads can be electrically connected to terminals outside the protective covering to allow the semiconductor die to be connected to higher level circuitry.

Market pressures continually drive semiconductor manufacturers to reduce the size of die packages and/or assemblies to fit within the space constraints of electronic devices while also driving them to increase the functional capacity of each assembly to meet operating parameters. One approach for increasing the processing power of a semiconductor assembly without substantially increasing the surface area covered by the assembly (the assembly's "footprint") is to vertically stack multiple semiconductor dies on top of one another in a single assembly. The dies in such vertically stacked assemblies can be interconnected by electrically coupling the bond pads of the individual dies with the bond pads of adjacent dies using through-silicon vias (TSVs). Often, these interconnects include pillars or bumps that increase the height of a vertical stack and limit the number of dies that can be included in a vertically stacked assembly.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

FIG. 1A is a side cross-sectional view of a semiconductor device configured in accordance with embodiments of the present technology.

FIG. 1B is a top view of the semiconductor device of FIG. 1A.

FIG. 2C is a side cross-sectional view of a semiconductor assembly at an initial stage in a manufacturing process in accordance with embodiments of the present technology.

DETAILED DESCRIPTION

Figure 1C:
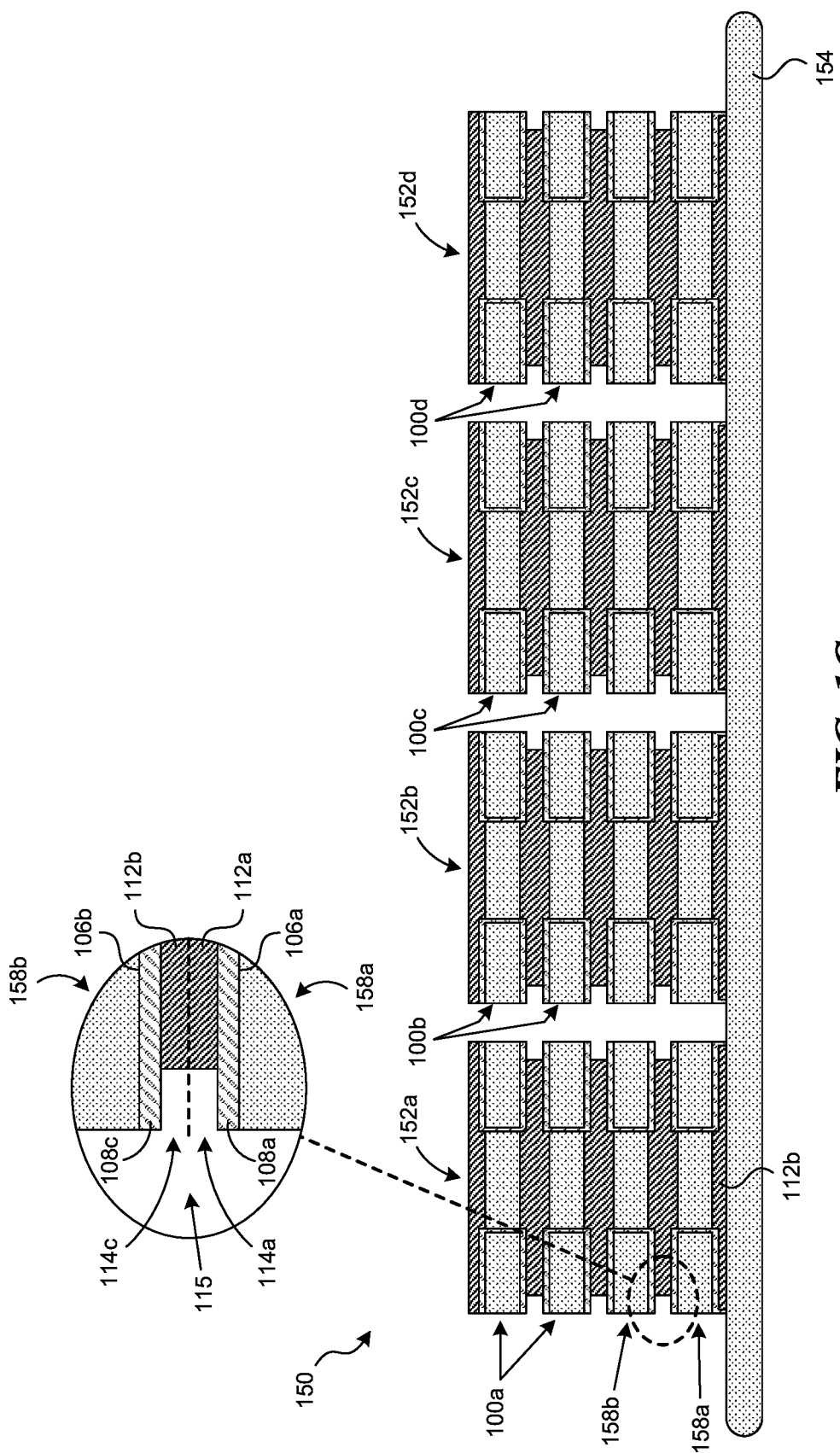
FIG. 1C is a side cross-sectional view of a semiconductor assembly at an initial stage in a manufacturing process in accordance with embodiments of the present technology.

Specific details of several embodiments of semiconductor devices, and associated systems and methods, are described below. In several of the embodiments described below, a semiconductor assembly configured in accordance with the present technology can include a first semiconductor device. The first semiconductor device can have an upper surface including a plurality of first metal structures at a first lateral edge of the upper surface. The metal structures can be a pad, bond pad, contact, layer, region, conductive element, etc., suitable for forming an electrical interconnection to another semiconductor device. The first semiconductor device can further include a first dielectric layer over the upper surface and including a plurality of first recesses extending inward from the first lateral edge and at least partially exposing the first metal structures. The semiconductor assembly can further include a second semiconductor device mounted on the first semiconductor device. The second semiconductor device can include a lower surface including a plurality of second metal structures at a second lateral edge of the lower surface. Each of the second metal structures can be aligned (e.g., vertically aligned) with a corresponding first metal structure on the first semiconductor device. The second semiconductor device can further include a second dielectric layer over the lower surface, including a plurality of second recesses at least partially exposing the second metal structures. The second dielectric layer can be bonded to the first dielectric layer of the first semiconductor device.

The semiconductor assembly can further include a plurality of plated structures positioned within the first and second recesses of the first and second semiconductor devices. Each plated structure can electrically couple a first metal structure of the first semiconductor device to a corresponding second metal structure of the second semiconductor device. In some embodiments, the plated structures are deposited in the first and second recesses using an electroless plating process. As a result, the first and second semiconductor devices can be stacked vertically to form a semiconductor assembly, and the plated structures electrically coupling the first and second devices can add minimal, if any, height to the assembly. Additionally, in contrast to conventional hybrid bonding techniques which typically require very tight planarization tolerances to form high yielding device interconnects, the recesses around the die described herein allow the plated structures to be formed after die stack formation, which can provide increased process margins, as the recesses described herein can also act as a guide for improved accuracy when aligning to neighboring semiconductor devices.

A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using semiconductor-manufacturing techniques whose details are well-known to those of skill in the art. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

Numerous specific details are disclosed herein to provide a thorough and enabling description of embodiments of the present technology. A person skilled in the art, however, will understand that the technology may have additional embodiments and that the technology may be practiced without several of the details of the embodiments described below with reference to FIGS. 1A-6. For example, some details of semiconductor devices and/or assemblies well known in the art have been omitted so as not to obscure the present technology. In general, it should be understood that various other devices and systems in addition to those specific embodiments disclosed herein may be within the scope of the present technology.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

FIG. 1A is a side cross-sectional view of a semiconductor device 100 ("device 100") configured in accordance with embodiments of the present technology. The device 100 can include a semiconductor die 102 including a semiconductor substrate 104 (e.g., a silicon substrate, a gallium arsenide substrate, an organic laminate substrate, etc.).

In the illustrated embodiment, the semiconductor substrate 104 (e.g., a silicon substrate, a gallium arsenide substrate, an organic laminate substrate, etc.) has a first side or surface 106a and a second side or surface 106b opposite the first side 106a. In some embodiments, the first side 106a can be an upper side of the substrate 104, and the second side 106b can be a lower side of the substrate 104. The first and/or second sides 106a-b of the semiconductor substrate 104 can be an active side or region including one or more circuit elements (e.g., wires, traces, interconnects, transistors, etc.) formed in and/or on the respective first and/or second side 106a-b. The circuit elements can include, for example, memory circuits (e.g., dynamic random memory (DRAM) or other type of memory circuits), controller circuits (e.g., DRAM controller circuits), logic circuits, and/or other circuits. In other embodiments, the semiconductor substrate 104 can be a "blank" substrate that does not include integrated circuit components and that is formed from, for example, crystalline, semi-crystalline, and/or ceramic substrate materials, such as silicon, polysilicon, aluminum oxide ($Al_2O_3$), sapphire, and/or other suitable materials.

In the illustrated embodiment, the first side 106a of the semiconductor substrate 104 can be electrically connected to a plurality of first side metal structures 108a-b, and the second side 106b of the semiconductor substrate 104 can be electrically connected to a plurality of second side metal structures 108c-d (the first and second side metal structures 108a-d are referred to collectively as "metal structures 108"). Each of the metal structures 108 can be positioned at or near an edge (e.g., lateral edge, periphery, outer perimeter, etc.) of the semiconductor die 102 and/or near a lateral surface of 113 of the semiconductor die 102. The metal structures 108 can be configured to electrically couple the device 100 to another semiconductor device, as described in detail further below. The first side metal structures 108a-b can correspond to the second side metal structures 108c-d, such that each metal structure on the first side 106a can be aligned (e.g., vertically) with a metal structure on the second side 106b (e.g., 108a with 108c, 108b with 108d). Each of the metal structures 108 can each have any suitable dimensions, such as a width and/or diameter less than or equal to 5 μm, 2 μm, 1 μm, 500 nm, 200 nm, or 100 nm.

In the illustrated embodiment, the first side metal structures 108a-b can be electrically connected to the corresponding second side metal structures 108c-d by a plurality of connectors 110. The connectors 110 can be or include, for example, one or more through-silicon vias (TSVs) extending through the semiconductor substrate 104 that electrically couple the first side metal structures 108a-b to corresponding second side metal structures 108c-d. As shown in FIG. 1A, the connectors 110 can be electrically coupled to the metal structures 108 via routing elements 111 (e.g., redistribution layers (RDL), metallization layers, traces, and/or other electrically conductive elements). In some embodiments, the connectors 110 are located at the interior and/or central portions of the semiconductor die 102, and the routing elements 111 can transmit signals from the connector 110 to the metal structures 108 at or near the lateral surfaces 113 of the semiconductor die 102.

In some embodiments, the connectors 110 and/or routing elements 111 can be electrically coupled to one or more circuit elements (not shown) formed in and/or on the first and/or second sides 106a-b of the semiconductor substrate 104. Accordingly, signals generated by the one or more circuit elements can be transmitted by the connectors 110 through the corresponding routing elements 111 to the metal structures 108. The metal structures 108, connectors 110, and/or routing elements 111 can be made of any suitable conductive material, such as copper, nickel, gold, silicon, tungsten, conductive-epoxy, any other suitable material, and combinations thereof.

The semiconductor die 102 further includes a first insulating material 112a formed over at least a portion of the first side 106a of the semiconductor substrate 104, and a second insulating material 112b formed over at least a portion of the second side 106b of the semiconductor substrate 104 (referred to collectively as "insulating material 112"). The insulating material 112 can additionally be formed between the semiconductor substrate 104 and the plurality of metal structures 108 on the first and second sides 106a-b of the semiconductor substrate 104. In some embodiments, one or more lateral surfaces 113 of the substrate 104 can be at least partially or fully covered by a lateral insulating material 116 (e.g., a passivating material).

The insulating material 112 and/or the lateral insulating material 116 can each include one or more layers of a suitable dielectric material (e.g., a passivation material, a polyimide material, and/or other materials used to cover a surface of a semiconductor device). For example, the insulating material 112 can comprise silicon oxide, silicon nitride, poly-silicon nitride, poly-silicon oxide, tetraethyl orthosilicate (TEOS), etc. In some embodiments, the insulating material 112 and/or lateral insulating material 116 can at least partially comprise a dielectric material with a small dielectric constant relative to silicon oxide (a "low-κ dielectric material"). Such low-κ dielectric materials can include fluorine-doped silicon dioxide, carbon-doped silicon dioxide, porous silicon dioxide, organic polymeric dielectrics, silicon based polymeric dielectrics, etc. In some embodiments, the insulating material 112 can be a dielectric material suitable for direct dielectric bonding (e.g., oxide-oxide bonding, nitride-nitride bonding, etc.) to a dielectric material on another semiconductor device, as described further below.

In the illustrated embodiment, the insulating material 112 includes a plurality of recesses 114a-d (referred to collectively as "recesses 114") extending inward from the edges (e.g., lateral edge, periphery, outer perimeter, etc.) of the first and second sides 106a-b of the semiconductor substrate 104. The locations and/or geometries of the recesses 114 can correspond to the locations and/or geometries of metal structures 108 such that each recess 114 can at least partially or fully expose one of the metal structures 108. As described in further detail below, the recesses 114 can provide space for forming plated structures to connect the metal structures 108 to another device. The recesses 114 can have any suitable dimension, such as a height H of at least 50 nm, 100 nm, 200 nm, 400 nm, 500 nm, 1 μm, 2 μm or 5 μm; and/or a depth D of at least 1 μm, 5 μm, 10 μm, 20 μm, or 25 μm. In some embodiments, each of the recesses 114 extend inward (e.g., from respective edges of the first and second sides 106a-b) by an equal amount.

FIG. 1B is a top view of the device 100 of FIG. 1A. Each of the metal structures 108 can be spaced apart and/or electrically isolated from each other by unrecessed areas of insulating material 112. In the illustrated embodiment, the metal structures 108 and recesses 114 are distributed along all four lateral sides of the device 100. In other embodiments, the metal structures 108 and/or recesses 114 can be distributed along one, two, or three of the lateral sides of the device 100. Each of the recesses 114 can have a width W of at least 1 μm, 5 μm, 10 μm, 20 μm, 25 μm, or any other suitable width. As best seen in FIG. 1B, the recesses 114 can have a square or rectangular shape and expose a correspondingly-shaped portion 109 of the metal structures 108. In other embodiment, the recesses 114 and/or metal structures 108 can have a circular, triangular, pentagonal, hexagonal, or any other suitable shape. Referring to FIGS. 1A and 1B together, in some embodiments, the recesses 114 on the first and second sides 106a-b of the semiconductor substrate 104 (the second side 106b is obscured in FIG. 1B) can each have the same geometry (e.g., size and/or shape). In other embodiments, some or all of the recesses 114 on the first and/or second sides 106a-b can have different geometries. Additionally, while the device 100 is depicted as having eight metal structures 108 and corresponding recesses 114 on each side 106a-b, in other embodiments the device 100 can include fewer or more metal structures 108 and corresponding recesses 114. For example, the device 100 can include one, two, three, four, five, six, seven, nine, ten or more metal structures 108 and corresponding recesses 114 arrayed between the substrate 104 and the insulating material 112.

FIG. 1C is a side cross-sectional view of a semiconductor assembly 150 ("assembly 150") at an initial stage in a manufacturing process in accordance with embodiments of the present technology. The assembly 150 includes a plurality of die stacks 152a-d (e.g., "first die stack 152a," "second die stack 152b," "third die stack 152c," and "fourth die stack 152d") coupled to an assembly substrate 154. In the illustrated embodiment, each of the die stacks 152a-d includes a respective plurality of vertically arranged semiconductor devices (e.g., first semiconductor devices 100a, second semiconductor devices 100b, third semiconductor devices 100c, and fourth semiconductor devices 100d—collectively, "devices 100"). Each of the devices 100 in the assembly 150 of FIG. 1C can be identical or similar to the device 100 as depicted in FIGS. 1A and 1B. For example, each of the devices 100 can include respective first and second sides 106a-b, metal structures 108, insulating material 112, and recesses 114, as previously described in connection with FIGS. 1A and 1B (reference numbers for these components are shown only for semiconductor devices 158a-b in the first die stack 152a merely for purposes of clarity).

For each of the die stacks 152a-d, the devices 100 can be vertically arranged such that the insulating materials 112 on the surfaces of neighboring semiconductor devices 158a-d are in direct contact with each other. In the illustrated embodiment, for example, the first insulating material 112a on the first side 106a of a lower semiconductor device 158a ("lower device 158a") contacts the second insulating material 112b on the second side 106b of an upper semiconductor device 158b ("upper device 158b"), as illustrated by the dashed line in the inset drawing. The first insulating material 112a on the lower device 158a can be mechanically coupled (e.g., via dielectric-dielectric bonding) to the second insulating material 112b on the upper device 158a. Accordingly, the lower and upper devices 158a-b can be mechanically coupled to each other via the bond between the first and second insulating materials 112a-b.

In some embodiments, the devices 100 can be arranged so that the recesses 114 and/or metal structures 108 of neighboring dies are aligned with each other. For example, as shown in FIG. 1C, the recesses 114a and/or metal structures 108a on the first side 106a of the lower device 158a can be vertically aligned with the corresponding recesses 114c and/or metal structures 108c on the second side 106b of the upper device 158b. Each pair of aligned recesses 114a, 114c can form a gap 115 separating the corresponding metal structures 108a, 108c of the lower and upper devices 158a-b. The gap 115 can provide a space for forming a plated structure to electrically couple the upper and lower devices 158a-b, as described further below.

Additionally, as depicted in FIG. 1C, the lowermost device 100 in each die stack 152a-d can be mechanically and electrically coupled to the assembly substrate 154. In the illustrated embodiment, for example, the second side 106b and/or the second insulating material 112b of the lower device 158a can be mechanically coupled to the assembly substrate 154 (e.g., via an adhesive layer, dielectric-dielectric bonding to an insulating layer on the assembly substrate 154, etc.), and any metal structures 108 on the second side 106b can be electrically and/or mechanically coupled to the assembly substrate 154 (e.g., to corresponding metal structures or other electrical contacts on the assembly substrate 154—not shown in FIG. 1C). The assembly substrate 154 can be any structure suitable for supporting the die stacks 152*a-d*, and can be or include a redistribution layer, an interposer, a printed circuit board, a dielectric spacer, another semiconductor die (e.g., a logic die), or another suitable substrate.

While the illustrated embodiment depicts the assembly 150 as having four die stacks 152*a-d*, where each stack includes four devices 100, in other embodiments the assembly 150 can include fewer or more die stacks (e.g., one, two, three, five, six, seven, eight, nine, ten, or more die stacks), and each die stack can include fewer or more devices 100 (e.g., one, two, three, five, six, seven, eight, nine, ten, or more devices).

Figure 1D:
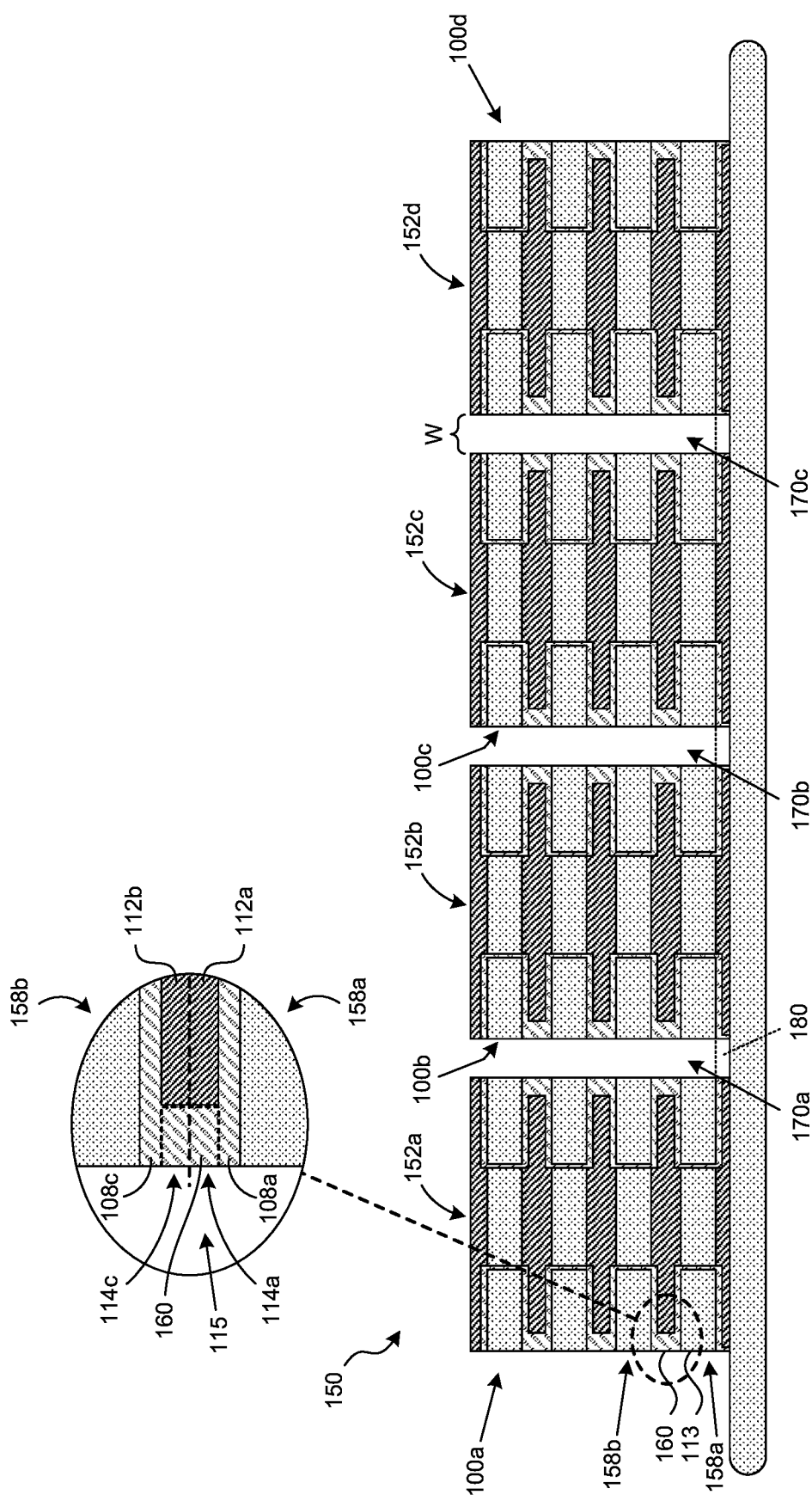
FIG. 1D is a side cross-sectional view of the semiconductor assembly of FIG. 1C at a subsequent stage in the manufacturing process.

FIG. 1D is a side cross-sectional view of the assembly 150 of FIG. 1C at a subsequent stage in the manufacturing process. In the illustrated embodiment, the assembly 150 includes a plurality of plated structures 160 that electrically couple neighboring semiconductor devices 100 (e.g., devices 158*a-b*) to each other. Each plated structure 160 can be positioned in a respective gap 115 between the corresponding aligned recesses 114*a*, 114*c* so as to bridge and/or electrically couple the corresponding metal structures 108*a* of the lower device 158*a* with the metal structures 108*c* of the upper device 158*b*. This configuration of the recesses 114, gaps 115, and/or plated structures 160 can advantageously reduce the vertical separation between individual devices 100. For example, because each plated structure 160 can be formed (e.g., plated) within the aligned recesses 114*a*, 114*c* and/or gap 115 formed when the lower device 158*a* is directly bonded to the upper device 158*b*, the plated structure 160 does not contribute to the overall height of the two bonded devices 158*a-b*.

The plated structure 160 can be made of any suitable conductive material, such as copper, nickel, gold, silicon, tungsten, conductive-epoxy, any other suitable material, and combinations thereof. The plated structures 160 can be formed using any suitable technique, such as by using an electroless plating process to deposit the conductive material into the corresponding recesses 114 and/or gaps 115. The electroless plating process can deposit a continuous volume of the conductive material on the metal structures 108 and in the recesses 114 and/or gaps 115 to form an electrical connection with little or no voiding, seams, gaps, etc. This can be advantageous for embodiments where the dimensions of metal structures 108, recesses 114, and/or gaps 115 are relatively small. Additionally, the electroless plating process can be performed at or near the end of a manufacturing process (e.g., after the die stacks 152*a-d* have been assembled) and can form the plurality of plated structures 160 in a single plating process. In other embodiments, however, the conductive material can be deposited using other techniques known to those of skill in the art, such as electroplating, chemical vapor deposition, physical vapor deposition, atomic layer deposition, and/or other suitable techniques.

In some embodiments, the process of forming the plated structures 160 can preferentially deposit the conductive material on the metal structures 108 and in the corresponding recesses 114 and/or the gap 115, rather than on the lateral surfaces 113 of the devices 100. Any of the conductive material that is deposited on the lateral surfaces 113 can be removed after the formation process is complete, e.g., using etching or techniques known to those of skill in the art. Alternatively, the amount of conductive material deposited on the lateral surfaces 113 can be sufficiently small and/or electrically isolated from each other such that it does not interfere with the electrical coupling of the devices 100 (e.g., does not electrically short adjacent plated structures 160). In other embodiments, however, the lateral surfaces 113 of the devices 100 can be at least partially or entirely covered by an insulating material (e.g., the lateral insulating material 116 of FIG. 1A) to at least reduce or prevent deposition of the conductive material on the lateral surfaces 113. In such embodiments, the insulating material can be deposited on the lateral surface 113 using lateral surface passivation process prior to forming the plated structures 160, as described in greater detail below.

In some embodiments the assembly 150 includes a plurality of channels 170*a-c* (referred to collectively as "channels 170") between the die stacks 152*a-d* such that each of the die stacks 152*a-d* are spaced apart from each other. For example, in the illustrated embodiment, the assembly 150 includes a first channel 170*a* between the first and second die stacks 152*a-b*, a second channel 170*b* between the second and third die stacks 152*b-c* and a third channel 170*c* between the third and fourth die stacks 152*c-d*. The assembly 150 can optionally include one or more bridge structures 180 (shown in phantom lines) within each channel 170. The bridge structures 180 can be made of an electrically conductive material (e.g., copper, nickel, gold, silicon, tungsten, conductive-epoxy, any other suitable material, and combinations thereof) configured to electrically couple neighboring die stacks to each other. As shown in FIG. 1D, the bridge structures 180 can bridge the metal structures 108 of the lowermost devices 100 in neighboring die stacks (e.g., 152*a-b*, 152*b-c*, and/or 152*c-d*) so the die stacks can communicate directly with each other.

The bridge structures 180 can be formed before, during, or after the formation of the plated structures 160. In some embodiments, the bridge structures 180 are formed using the same or a similar technique as the plated structures 160, such as via an electroless plating process. In such embodiments, the channels 170 can have dimensions that are sufficiently small to allow the bridge structures 180 to be formed between the die stacks. For example, the channels 170 can have a width W that is no more than 500 µm, 400 µm, 300 µm, 250 µm, 200 µm, 150 µm, 100 µm, 50 µm, 20 µm, or 10 µm. Optionally, the portions of the assembly substrate 154 near the channels 170 can include grooves, cuts, etc., formed therein (not shown) to provide additional surface area for deposition of material to form the bridge structures 180. In other embodiments, however, the bridge structures 180 are omitted, and the die stacks can instead communicate with each other via the assembly substrate 154.

In some embodiments, after the plated structures 160 are formed, the assembly 150 can be incorporated into a semiconductor package. For example, the assembly substrate 154 can be coupled to conductive elements (e.g., solder balls, conductive bumps, conductive pillars, conductive epoxies, and/or other suitable electrically conductive elements—not shown) configured to electrically couple the assembly 150 to an external device. Additionally, the assembly 150 can be encapsulated in a mold material, such as a resin, epoxy resin, silicone-based material, polyimide, or any other material suitable for protecting the various components of the assembly 150 from contaminants and/or physical damage.

Figure 2A:
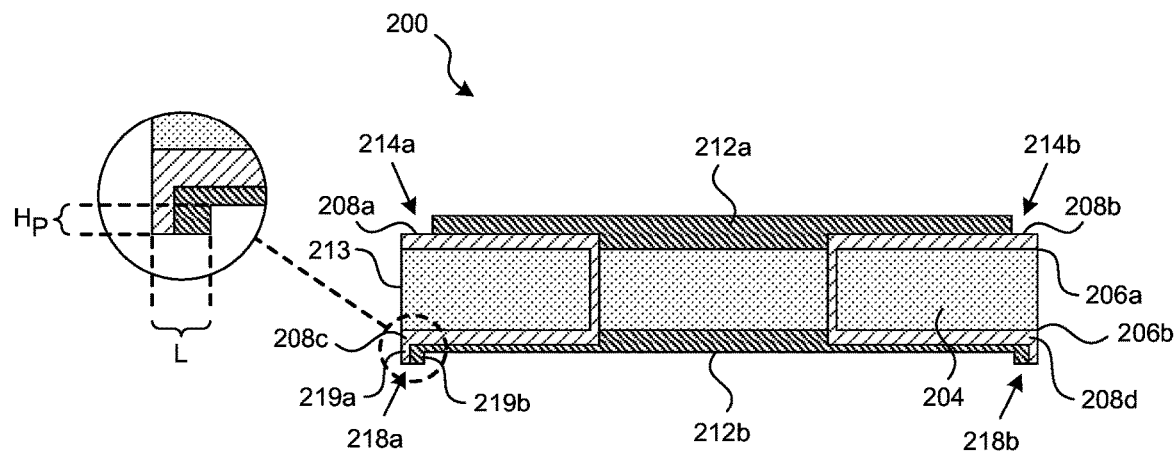
FIG. 2A is a side cross-sectional view of a semiconductor device, in accordance with embodiments of the present technology.
Figure 2B:
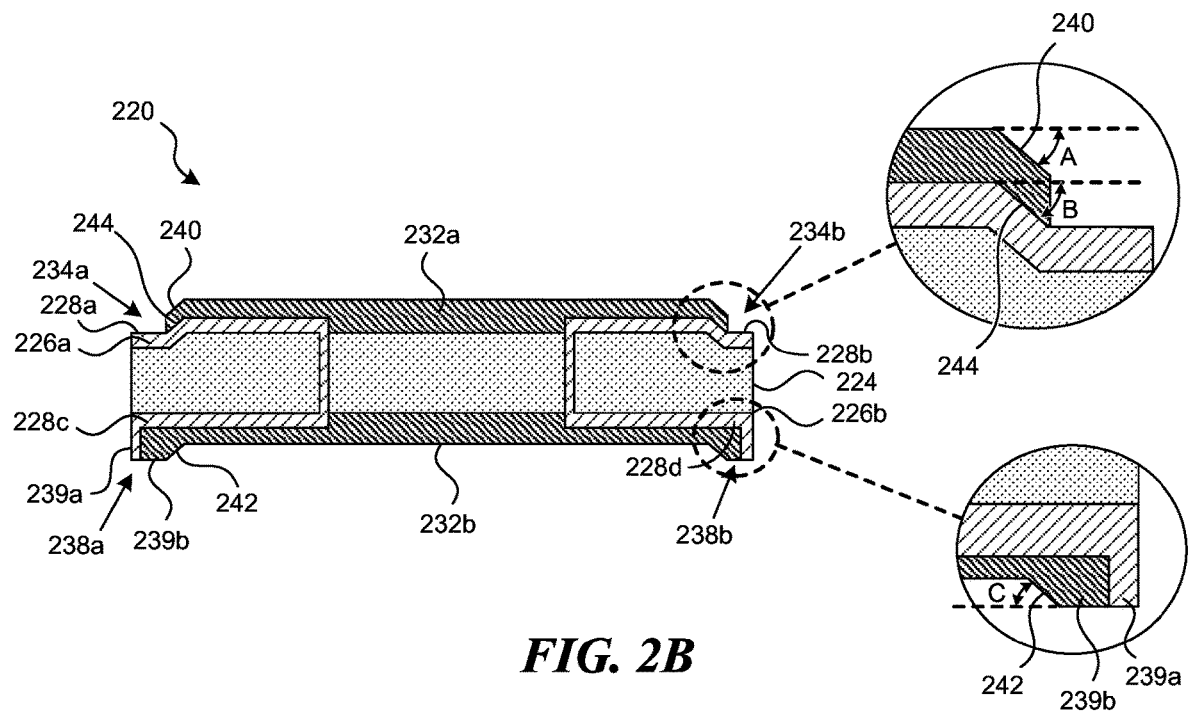
FIG. 2B is a side cross-sectional view of another semiconductor device, in accordance with embodiments of the present technology.

FIGS. 2A and 2B are respective cross-sectional views of semiconductor devices 200, 220, in accordance with embodiments of the present technology. The components of the semiconductor devices 200, 220 of FIGS. 2A and 2B, respectively, can be generally similar to the components of the device 100 of FIGS. 1A and 1B. Accordingly, like numbers (e.g., semiconductor substrate 104 versus semiconductor substrates 204, 224) are used to identify similar or identical components, and the discussion of the semiconductor devices 200, 220 of FIGS. 2A and 2B will be generally limited to those features that differ from the device 100 of FIGS. 1A and 1B, and other similar features necessary for context. Additionally, any of the features of the semiconductor devices 200, 220 of FIGS. 2A and 2B can be combined with each other and/or with the device 100 of FIGS. 1A and 1B.

Referring first to FIG. 2A, the semiconductor device 200 ("device 200") includes a plurality of recesses 214a-b (referred to collectively as "recesses 214") in a first insulating material 212a on a first side or surface 206a (e.g., an upper side) of the semiconductor substrate 204. The recesses 214 can be identical or generally similar to the recesses 114 in FIGS. 1A and 1B (e.g., with respect to height, depth, shape, etc.). The locations and/or geometries of the recesses 114 can correspond to the locations and/or geometries of a plurality of metal structures 208a-b (referred to collectively as "metal structures 208") such that each recess 114 can at least partially or fully expose the metal structures 208.

The device 200 also includes a plurality of conductive protrusions 218a-b (referred to collectively as "protrusions 218") extending from the second side or surface 206b (e.g., a lower side) of the semiconductor substrate 204 and/or the second insulating material 212b thereon. Each of the protrusions 218 can be located at or near an edge and/or a lateral surface 213 of the device 200. Each protrusion 218 can be or include a conductive element suitable for forming an electrical interconnection to another semiconductor device, such that each protrusion 218 can be coupled to a respective one of the metal structures 208c-d on the second side 206b of the semiconductor substrate 204. For example, in the illustrated embodiment the protrusion 218a is electrically coupled to metal structure 208c, and the protrusion 218b is electrically coupled to the metal structure 208d. Each of the plurality of protrusions 218a-b can include a conductive region 219a and an insulating region 219b. The conductive region 219a can be electrically coupled to the metal structures 208c-d on the second side 206b of the semiconductor substrate. The insulating region 219b can be coupled to the second insulating material 212b. In other embodiments, the plurality of protrusions 218a-b can include only the conductive region 219a.

The locations and/or geometries of the protrusions 218 can correspond to locations and/or geometries of the recesses 214, e.g., to facilitate alignment during die stack formation as described further below with reference to FIG. 2C. In some embodiments, the recesses 214 have a shape complementary to the corresponding protrusions 218. For example, the recesses 214 can have a shape similar to the recesses 114 of FIGS. 1A-1B (e.g., square, rectangular, circular, triangular, pentagonal, hexagonal, or any other suitable shape), and the protrusions 218 can have a corresponding shape such that the protrusions 218 can fit at least partially within the recesses 214 of another semiconductor device, as described in detail below.

The recesses 214 can have a height and/or depth selected as discussed previously regarding the recesses 114 in FIGS. 1A and 1B (e.g., height H and depth D), or any other suitable height and/or depth. The protrusions 218 can have dimensions similar to the dimensions of the recesses 214. For example, the protrusions 218 can have a height $H_P$ of at least 50 nm, 100 nm, 200 nm, 400 nm, 500 nm, 1 μm, 2 μm, or 5 μm; and/or a length L of at least 1 μm, 5 μm, 10 μm, 20 μm, or 25 μm. In some embodiments, the dimensions of the protrusions 218 can be sufficiently smaller than the dimensions of the recesses 214 (e.g., L<D; and/or $H_P$<H) such that the protrusions 218 can be fit at least partially within the corresponding recesses 214 of another semiconductor device.

Referring next to FIG. 2B, the semiconductor device 220 (device 220") can be generally similar to the device 200 of FIG. 2A, except that the recesses 234 and protrusions 238 of the device 220 include sloped (e.g., beveled) surfaces. As shown in FIG. 2B, the device 220 includes a plurality of recesses 234a-b in a first insulating material 232a on a first side 226a (e.g., an upper side) of the semiconductor substrate 224 and exposing a plurality of metal structures 228a-b. The device 220 also includes a plurality of conductive protrusions 238a-b (collectively "protrusions 238") extending from the second side 226b of the semiconductor substrate 224 and electrically coupled to respective metal structures 228c-d. Each of the protrusions 238 can include a conductive region 239a similar to or generally the same as the conductive region 219a of FIG. 2A, and an insulating region 239b similar to or generally the same as the insulating region 219b of FIG. 2A. The recesses 234a-b can have dimensions (e.g., height, depth) similar to the recesses 114 in FIGS. 1A and 1B. The protrusions 238a-b can have dimensions similar to the dimensions of the recesses 234a-b so the protrusions 238a-b can fit at least partially within corresponding recesses 234a-b of another semiconductor device.

In the illustrated embodiment, first insulating material 232a further includes a first bevel 240 at an edge of the first insulating material 232a surrounding (e.g., abutting, adjacent, proximate) the recesses 234a-b. Additionally, the device 220 can include a metal structure bevel 244 aligned beneath and corresponding to the first bevel 240. The metal structure bevel 244 can be part of the metal structure 228, or can be electrically and/or mechanically coupled to the metal structure 228. The insulating region 239b and/or the second insulating material layer 232b can further include a second bevel 242 corresponding to the first bevel 240 in the first insulating material 232a. The locations and/or geometries of the second bevel 242 can correspond to the locations and/or geometries of the first bevel 240, e.g., to facilitate alignment during die stack formation as described further below with reference to FIG. 2C. The first bevel 240, second bevel 242, and metal structure bevel 244 can have any suitable geometry. For example, the first bevel 240 can have an angle A, the metal structure bevel 244 can have an angle B, and the second bevel 242 can have an angle C. Angles A, B, and C can each independently be at least 10°, 20°, 30°, 40°, 50°, 60°, 70°, 80°, 90°, or any other suitable angle. In some embodiments, angles A, B, and C can each be the same angle, or some or all of angles A, B, and C can be different angles. Additionally, the first bevel 240, second bevel 242, and/or the metal structure bevel 244 can be chamfered, tapered, concave, convex, or any other suitable shape.

Figure 2D:
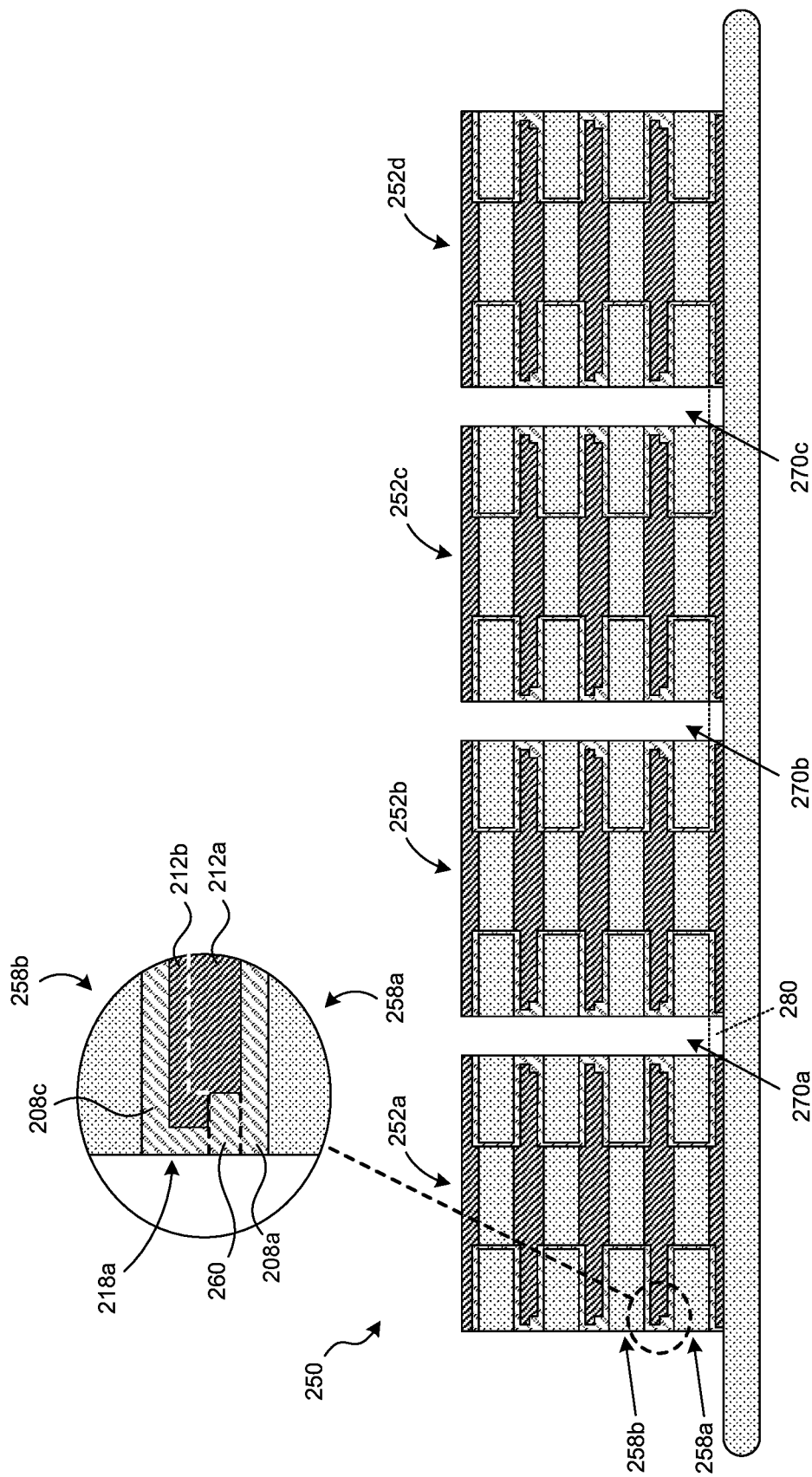
FIG. 2D is a side cross-sectional view of the semiconductor assembly of FIG. 2C at a subsequent stage in a manufacturing process.

FIGS. 2C and 2D are a side cross-sectional view of a semiconductor assembly 250 ("assembly 250") at various stages in a manufacturing process in accordance with embodiments of the present technology. The components of the assembly of FIGS. 2A and 2D can be generally similar to the components of the assembly 150 of FIGS. 1C and 1D. Accordingly, like numbers (e.g., assembly 150 versus assembly 250) are used to identify similar or identical components, and the discussion of the assembly 250 of FIGS. 2C and 2D will be limited to those features that differ from the assembly 150 of FIGS. 1C and 1D, and other similar features necessary for context. Additionally, any of the features of the assembly 250 of FIGS. 2C and 2D can be combined with each other and/or with the assembly 150 of FIGS. 1C and 1D.

Referring first to FIG. 2C, at an initial stage in a manufacturing process, the assembly 250 includes a plurality of semiconductor die stacks 252a-d, and each of the die stacks 252a-d can include a respective plurality of semiconductor devices 200a-d (collectively "devices 200"). Although the devices 200a-d are depicted as being identical or similar to the device 200 of FIG. 2A, in other embodiments the devices 200a-d can be identical or similar to the device 220 of FIG. 2B. Optionally, at least one of the die stacks 252a-d can include devices identical or similar to the device 200 of FIG. 2A, and at least a second one of the die stacks 252a-d can include devices identical or similar to the device 220 of FIG. 2B.

Each of the devices 200 can include a plurality of metal structures 208, a plurality of recesses 214, and a plurality of conductive protrusions 218 (reference numbers are shown only for devices 258a-b of the die stack 252a for purposes of clarity). The devices 200 can be arranged so that the recesses 214 and protrusions 218 of neighboring dies are aligned with each other. For example, as shown in FIG. 2C, the recesses 214a and/or metal structures 208a of the lower device 158a can be vertically aligned with the corresponding protrusions 218a of the upper device 158b. In some embodiments, the protrusions 218a can occupy at least a portion of the corresponding recesses 214a such that the metal structures 208a remain at least partially exposed. In other embodiments, however, the protrusions 218a can completely fill the corresponding recesses 214a and/or directly contact the metal structures 208a. The complementary locations and/or geometries of the recesses 214 and the protrusions 218 can facilitate alignment of neighboring (e.g., vertically aligned) devices 200. For example, the protrusions 218 of the upper device 258b can fit at least partially within by the recesses 214 of the lower device 258a such that the upper device 258b can be at least partially mechanically coupled to the lower device 258a.

Referring again to FIG. 2C, the lowermost devices 200 in each die stack 252a-d can be mechanically and electrically coupled to an assembly substrate 254. In the illustrated embodiment, for example, the second side 206b and/or the second insulating material 212b of the lower device 258a can be mechanically coupled to the assembly substrate 254 (e.g., via an adhesive layer, dielectric-dielectric bonding to an insulating layer on the assembly substrate 254, etc.), and any metal structures 208 and/or protrusions 218 on the second side 206b can be electrically and/or mechanically coupled to the assembly substrate 254 (e.g., to corresponding metal structures or other electrical contacts on the assembly substrate 254—not shown in FIG. 2C).

Referring next to FIG. 2D, at a subsequent stage in a manufacturing process, the assembly 250 includes a plurality of plated structures 260, which can be generally similar to the plated structures 160 of FIG. 1D. The plated structures 260 can electrically couple neighboring semiconductor devices 200 to each other. Each plated structure 260 can be positioned between the corresponding recesses 214a and protrusions 218a of the lower and upper devices 258a-b so as to bridge and/or electrically couple the metal structures 208a of the lower device 258a to the corresponding protrusions 218a of the upper device 258b. The plated structures 260 can be made of any suitable conductive material, such as copper, nickel, gold, silicon, tungsten, conductive-epoxy, any other suitable material, and combinations thereof. The plated structures 260 can be formed using techniques identical or generally similar to the techniques described previously with respect to FIGS. 1C and 1D and the plated structures 160.

In some embodiments, the assembly 250 can further include a plurality of channels 270a-c between the die stacks 252a-d such that each of the die stacks 252a-d are spaced apart from each other. The channels 270a-c can be identical or generally similar to the channels 170a-c of FIG. 1D. The assembly 250 can optionally include one or more bridge structures 280 (shown in phantom lines) within each channel 270. The bridge structures 280 can be identical or generally similar to the bridge structures 180 of FIG. 1D.

Figure 2E:
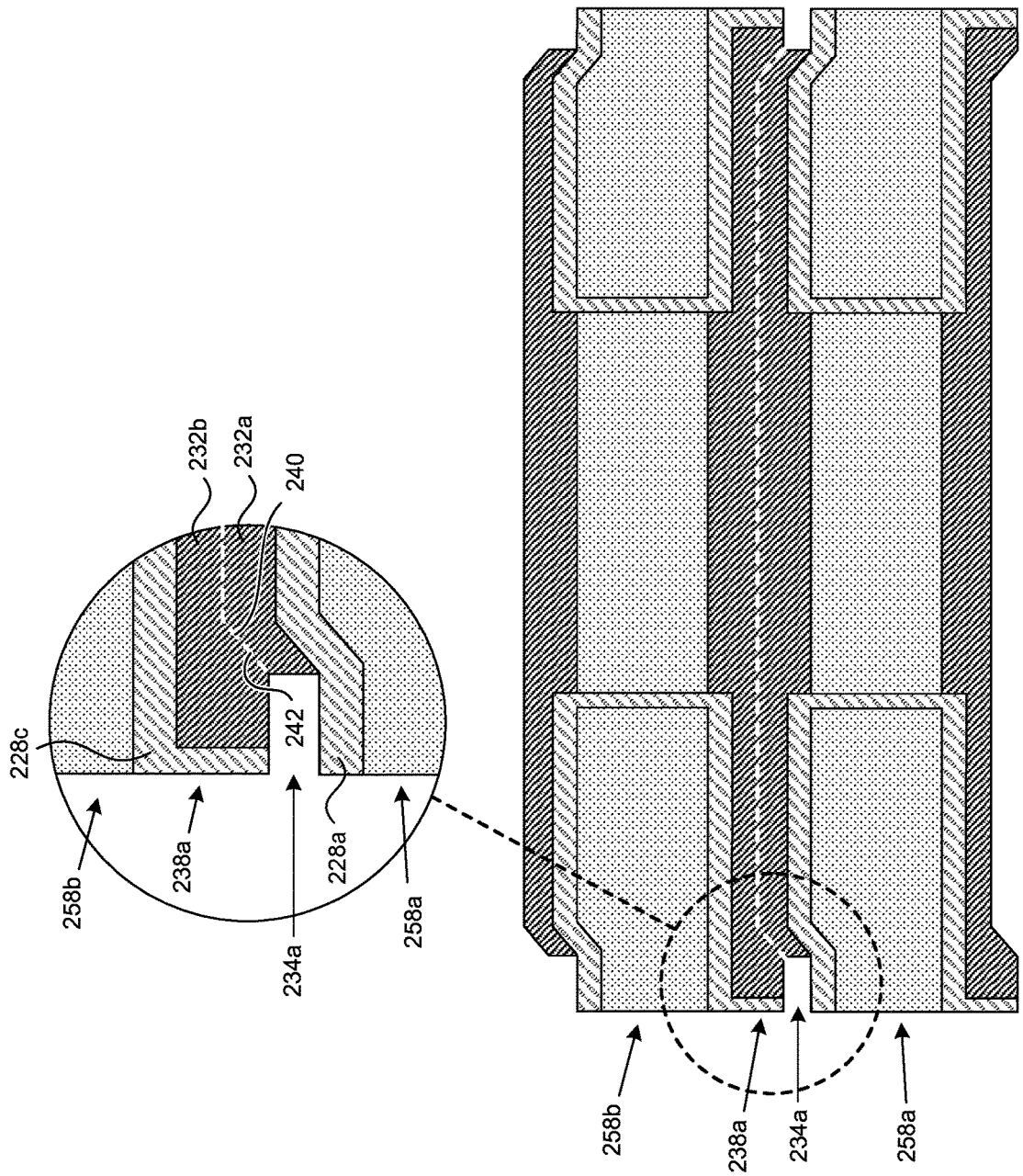
FIG. 2E is a side cross-sectional view of a lower device and an upper device, in accordance with embodiments of the present technology.

Although the assembly 250 illustrated in FIGS. 2C and 2D includes protrusions 218 configured in accordance with the embodiments of FIG. 2A, in other embodiments the assembly 250 can include conductive protrusions configured in accordance with the embodiments of FIG. 2B. For example, as shown in FIG. 2E, a lower device 258a has a recess 234a that includes a first bevel 240, and an upper device 258b has a protrusion 238a that includes a second bevel 242. The first bevel 240 of the lower device 258a can be vertically aligned with the second bevel 242 of the upper device. As discussed previously with regard to FIG. 2B, the first bevel 240 and the second bevels 242 can have a same angle. The complementary locations and/or geometries of the first and second bevels 240, 242 can facilitate alignment of the devices 258a-b. For example, the angled surfaces of the first and second bevels 240, 242 can guide (e.g., lead, direct, etc.) the partially aligned protrusion 238a towards the corresponding recess 234a. This can advantageously facilitate die stack alignment during the manufacturing process. Subsequently, a plated structure (not shown) can be formed in the recess 234a to electrically couple the metal structures 228a, 228c of the devices 258a-b, as previously described with respect to FIG. 2D. In still other embodiments, the assembly 250 can include a combination of the conductive protrusions of FIGS. 2A and 2B and can additionally include conductive protrusions having any other suitable configuration.

FIGS. 3A through 3D are side cross-sectional views illustrating various stages of a process or method for manufacturing a plurality of semiconductor devices, in accordance with embodiments of the present technology. The method can be used to manufacture any embodiment of the semiconductor devices described herein, and/or one or more components thereof (e.g., the device 100 of FIGS. 1A and 1B, the device 200 of FIG. 2A, and the device 220 of FIG. 2B). Although FIGS. 3A-3D illustrate a manufacturing method for five semiconductor devices, in practice the method can be scaled or otherwise adapted for any suitable number of semiconductor devices (e.g., a single semiconductor device, tens or hundreds of semiconductor devices, etc.).

Figure 3A:
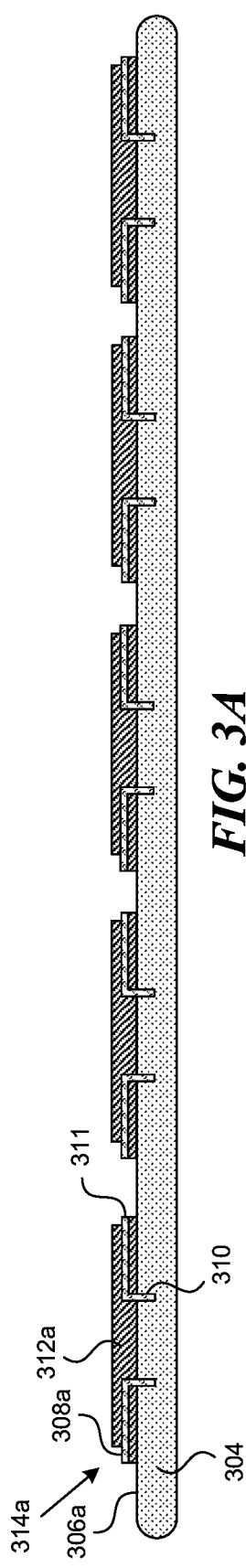
FIGS. 3A through 3D are side cross-sectional views illustrating various stages of a process or method for manufacturing a plurality of semiconductor devices, in accordance with embodiments of the present technology.

Referring first to FIG. 3A, the method includes forming a plurality of connectors 310 on and/or at least partially through a first side 306a of a semiconductor substrate 304. The connectors 310 can be or include, for example, one or more through-silicon vias (TSVs) extending at least partially through the semiconductor substrate 304. The method can further include forming a plurality of metal structures 308a on a first side 306a of a semiconductor substrate 304. The metal structures 308 can be electrically coupled to the connectors 310 via routing elements 311 (e.g., RDL, metallization layers, traces, and/or other electrically conductive elements). The method can further include forming a first insulating material 312a on the first side 306a and/or at least partially over the metal structures 308a, in accordance with semiconductor manufacturing techniques known to those of skill in the art. The method can also include forming a first plurality of recesses 314a in the first insulating material 312a to partially or fully expose the metal structures 308a. For example, the first insulating material 312a can be deposited over portions of or the entirety of the metal structures 308a, then the recesses 314 can be formed by selectively removing some or all of the first insulating material 312a over the metal structures 308a, e.g., using etching or other suitable material removal techniques. Alternatively, the first insulating material 312a can be selectively deposited on the first side 306a at locations away from the metal structures 308a so the metal structures 308a remain exposed. The first insulating material 312a can be any suitable insulating material, including those discussed herein (e.g., insulating material 112a-b of FIGS. 1A and 1B), and can be formed using techniques known to those of skill in the art, such as a chemical vapor deposition (CVD) process.

Figure 3B:
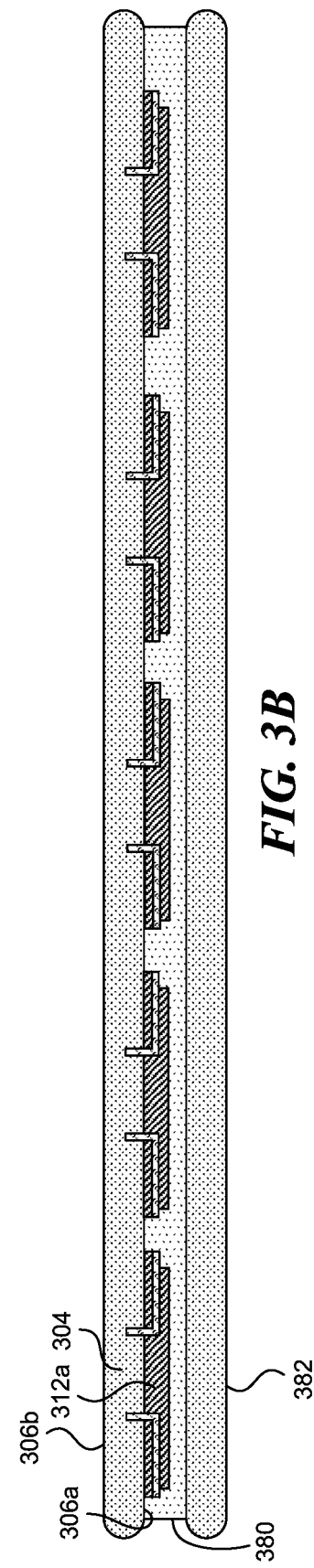

Referring next to FIG. 3B, the method further includes using an adhesive 380 to bond the first side 306a of the semiconductor substrate 304 and the first insulating material 312a to a first carrier substrate 382. The adhesive 380 can be any suitable adhesive material known to those of skill in the art. The first carrier substrate 382 can be a wafer or other structure made from silicon, glass, ceramic, or any other suitable material.

Figure 3C:
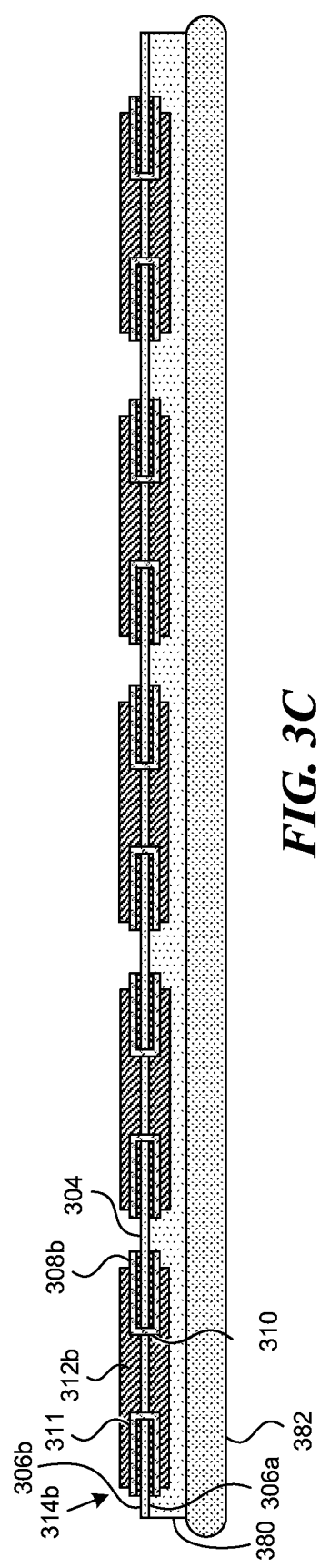

Referring next to FIG. 3C, the method further includes thinning a second side 306b of the semiconductor substrate 304. Thinning the second side 306b of the semiconductor substrate 304 can be accomplished using techniques known to those of skill in the art, such as a chemical-mechanical planarization (CMP) process. After thinning, the method can then include forming a plurality of second metal structures 308b, a plurality of routing elements 311, a second insulating material 312b, and a second plurality of recesses 314b on the second side 306b. The connectors 310 can electrically couple the routing elements 311 and the plurality of second metal structures 308b. The routing elements 311 and/or plurality of second metal structure 308b can be formed from the same and/or different conductive material, and can be formed using techniques known to those of skill in the art. The second insulating material 312b can be any suitable insulating material, including those discussed herein (e.g., insulating material 112a-b of FIGS. 1A and 1B), and can be formed using techniques known to those of skill in the art, such as a chemical vapor deposition (CVD) process.

Figure 3D:
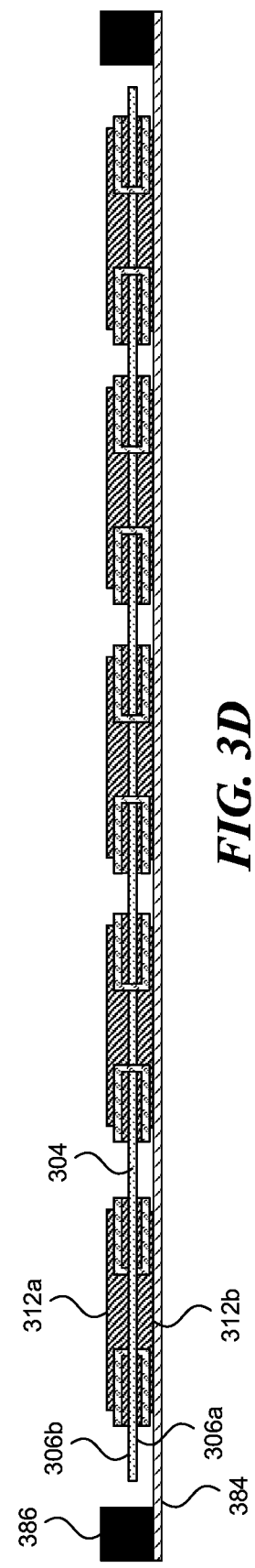

Referring next to FIG. 3D, the method further includes coupling the second side 306b of the semiconductor substrate 304 and the second insulating material 312b to a second carrier substrate 384, and separating the first side 306a of the semiconductor substrate 304 and the first insulating material 312a from the adhesive 380 and first carrier substrate 382 of FIG. 3C. The first carrier substrate 382 can be separated from the first side 306a and first insulating material 312a by dissolving, debonding, or otherwise decoupling the adhesive 380, e.g., using a suitable stimulus (e.g., heat, light) or agent (e.g., solvent, water). In some embodiments, the second carrier substrate 384 can be a dicing tape mounted on a film frame 386. The semiconductor substrate 304 can then be diced to form a plurality of singulated semiconductor devices (not shown).

FIGS. 4A-4L are side cross-sectional views illustrating various stages of a process or method for manufacturing a plurality of semiconductor devices, in accordance with embodiments of the present technology. The method can be used to apply a passivation material to a lateral surface of a semiconductor device (e.g., device 100 of FIG. 1A, device 200 of FIG. 2A, and/or device 220 of FIG. 2B). The method can be used during the manufacture of any embodiment of the semiconductor devices described herein, and/or one or more components thereof (e.g., the device 100 of FIGS. 1A and 1B, the device 200 of FIG. 2A, and/or the device 220 of FIG. 2B). Optionally, some or all of the steps of the method of FIGS. 4A-4L can be combined with some or all of steps of the method of FIGS. 3A-3D.

Figure 4A:
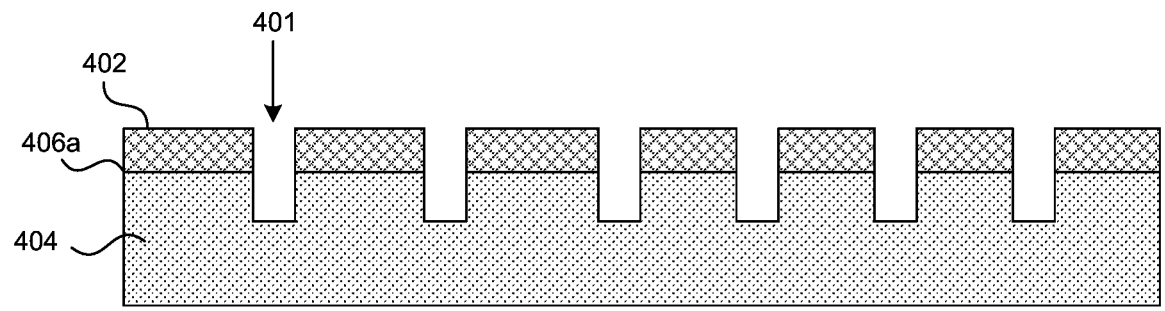
FIGS. 4A-4L are side cross-sectional views illustrating various stages of a process or method for manufacturing a plurality of semiconductor devices, in accordance with embodiments of the present technology.

Referring first to FIG. 4A, the method includes forming a plurality of grooves 401 in a first side 406a of a semiconductor substrate 404. The semiconductor substrate 404 can include functional elements such as circuit elements, connectors (e.g., vias), etc., as previously described (omitted for purposes of clarity). The grooves 401 can be formed in the semiconductor substrate 404 in accordance with techniques known to those of skill in the art. For example, the grooves 401 can be formed by depositing a photoresist 402 on the first side 406a, selectively removing portions of the photoresist 402 over the desired locations of the grooves 401, and then selectively removing portions of the semiconductor substrate 404 not covered by the photoresist 402 (e.g., using dry etching) to form the grooves 401. The photoresist 402 can be removed after the grooves 401 are formed.

Figure 4B:
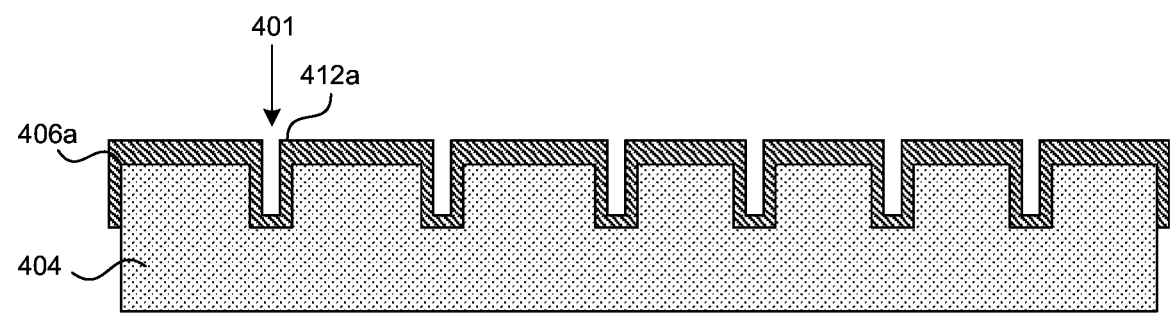

Referring next to FIG. 4B, the method further includes forming a first insulating material 412a on the first side 406a and in the grooves 401 of the semiconductor substrate 404. The first insulating material 412a can be any insulating material as discussed previously, and can be deposited using any suitable technique known to those of skill in the art. For example, the first insulating material 412a can be a nitride or oxide material, and can be deposited using a chemical vapor deposition (CVD) process.

Figure 4C:
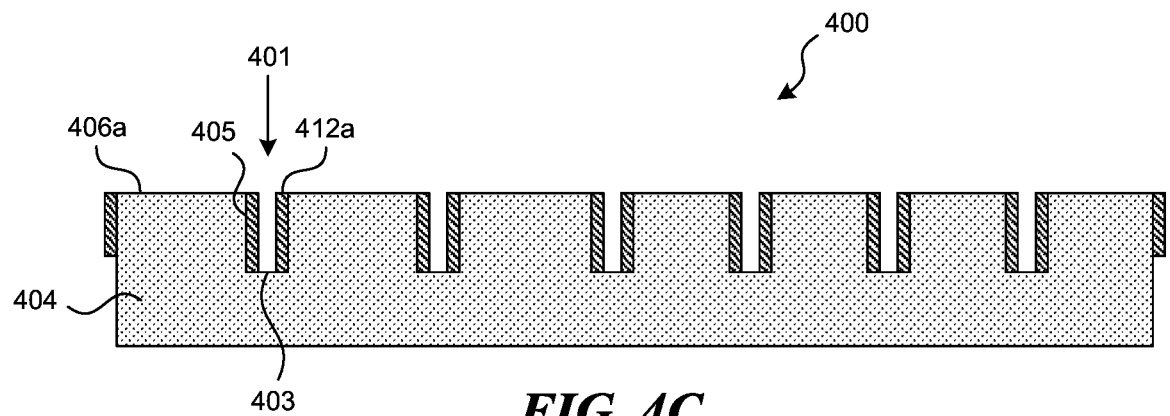

Referring next to FIG. 4C, the method further includes selectively removing the portions of the first insulating material 412a that are on the horizontal surfaces of the semiconductor substrate 404 (e.g., first side 406a and/or bottom surfaces 403 of the grooves 401), while preserving the portions of the first insulating material 412a that are on the vertical surfaces 405 of the grooves 401. This can be accomplished using any suitable technique known to those of skill in the art, such as by dry etching.

Figure 4D:
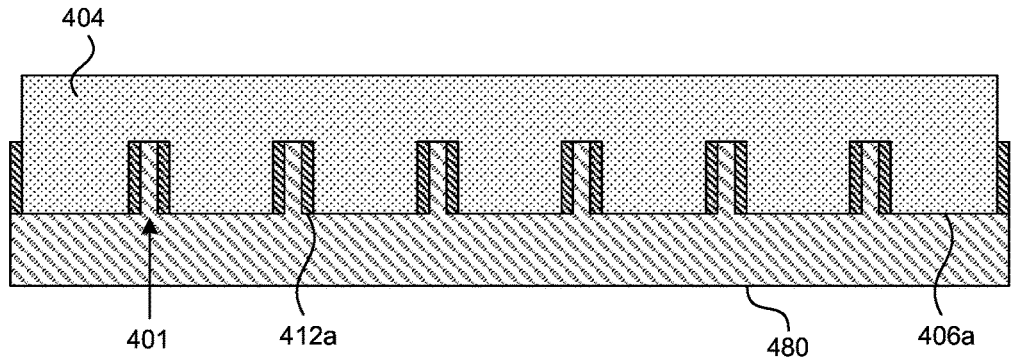

Referring next to FIG. 4D (the orientation of the semiconductor substrate 404 is reversed relative to FIGS. 4A-4C), the method further includes depositing an adhesive 480 to at least partially cover the first side 406a of the semiconductor substrate 404 and at least partially or fully fill the grooves 401. The adhesive 480 can be a thermoset adhesive (e.g., a thermoset adhesive manufactured by Nissan Chemical), or any other suitable adhesive. The adhesive 480 can be deposited using any suitable technique known to those of skill in the art, such as spin coating, dip coating, spray coating, etc.

Figure 4E:
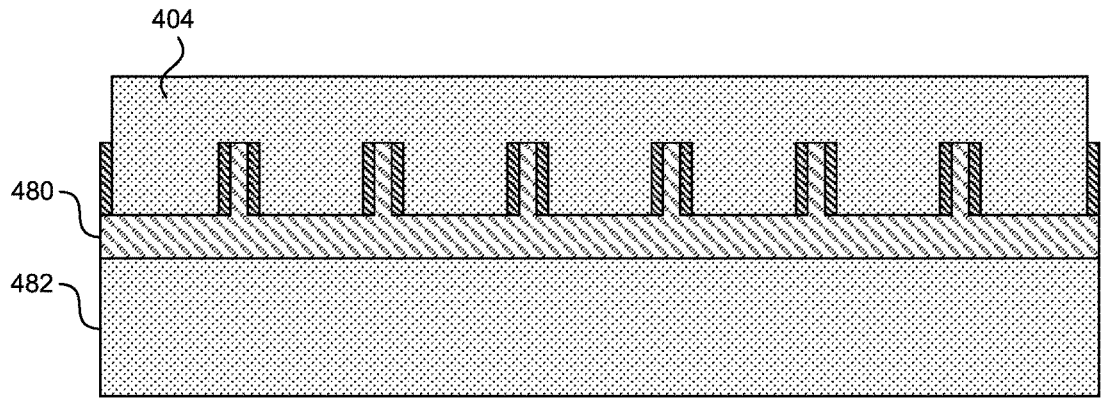

Referring next to FIG. 4E, the method further includes using the adhesive 480 to bond the semiconductor substrate 404 to a carrier substrate 482. The carrier substrate 482 can be a wafer or other structure made from silicon, glass, ceramic, or any other suitable material.

Figure 4F:
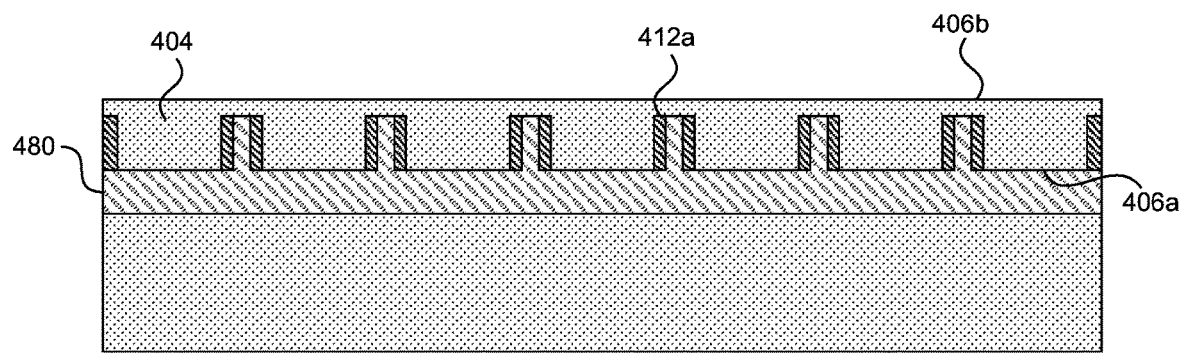

Referring next to FIG. 4F, the method further includes removing at least a portion of the semiconductor substrate 404 from a second side 406b of the semiconductor substrate 404. The portion of the semiconductor substrate 404 can be removed using, for example, a CMP process, or any suitable technique known to those of skill in the art. In some embodiments, the amount of the semiconductor substrate 404 removed can be sufficiently small such that the first insulating material 412a and adhesive 480 are not exposed and remain covered by a portion of the semiconductor substrate 404. In other embodiments, however, the amount of semiconductor substrate 404 removed can be sufficiently large such that at least some of the first insulating material 412a and adhesive 480 are exposed at the second side 406b of the semiconductor substrate 404.

Figure 4G:
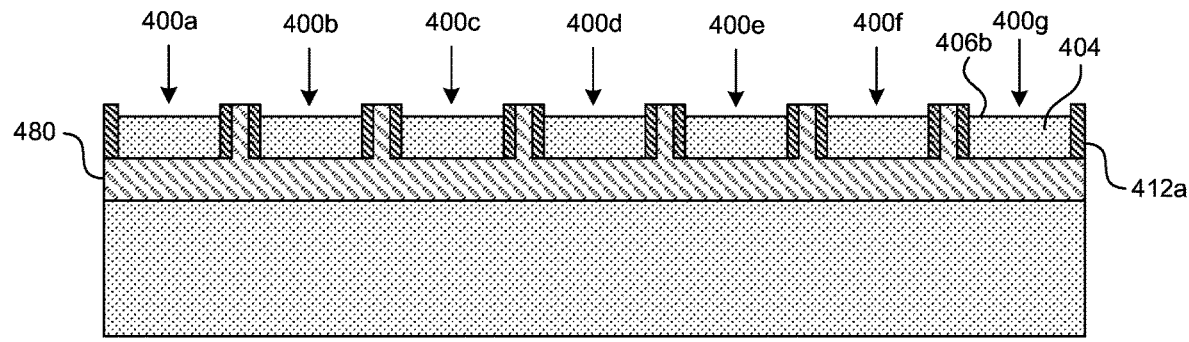

Referring next to FIG. 4G, the method further includes selectively removing additional portions of the second side 406b of the semiconductor substrate 404 to expose one or more connectors (e.g., vias) formed in the semiconductor substrate 404 (not shown in FIG. 4G). The portion of the semiconductor substrate 404 can be removed using, for example, a silicon dry etch process, or any suitable technique known to those of skill in the art. In the illustrated embodiment, after the removal process, the first insulating material 412a and the adhesive 480 can be exposed and can extend beyond the second side 406b of the semiconductor substrate 404. Accordingly, the semiconductor substrate 404 can be divided into a plurality of discrete dies 400a-g (collectively, "dies 400") by the first insulating material 412 and the adhesive 480.

Figure 4H:
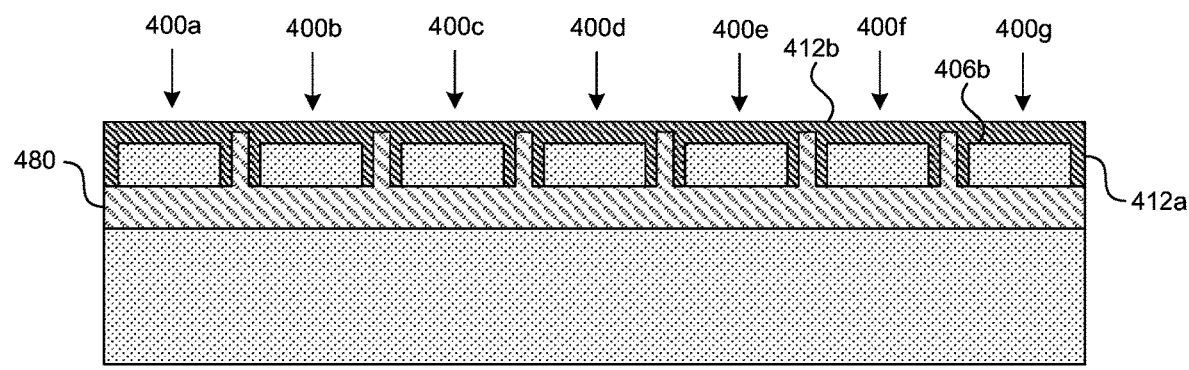

Referring next to FIG. 4H, the method further includes depositing a second insulating material 412b on the second side 406b of the dies 400 to at least partially cover the dies 400, the first insulating material 412a, and/or the adhesive 480 between the dies 400. The second insulating material 412b can be the same or different as the first insulating material 412a, and can be any suitable insulating material, including the materials discussed previously (e.g., an oxide or nitride material). The second insulating material 412b can be deposited using any suitable technique known to those of skill in the art.

Figure 4I:
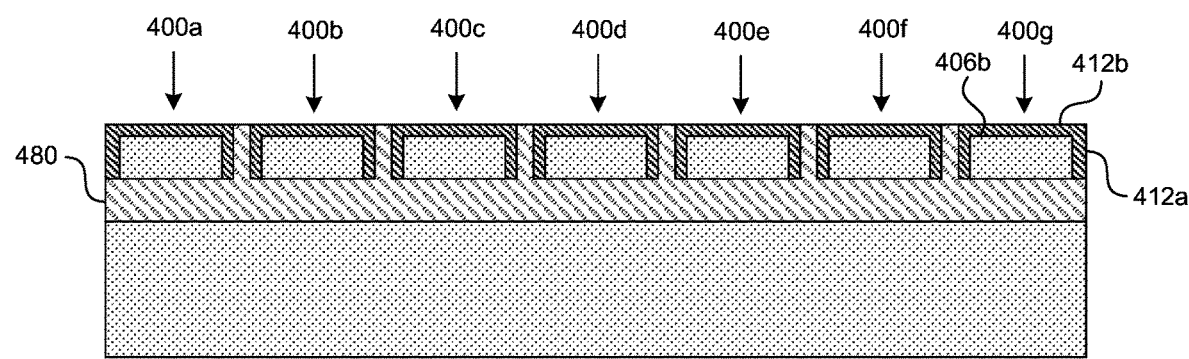

Referring next to FIG. 4I, the method further includes removing a portion of the second insulating material 412b to expose the vias (not shown) on the second side 406b of the dies 400. In the illustrated embodiment, this further includes removing the portions of second insulating material 412b positioned above the adhesive 480 to at least partially expose the adhesive 480 between the individual dies 400. The portion(s) of the second insulating material 412b can be removed using any suitable technique known to those of skill in the art, such as an oxide CMP process.

Figure 4J:
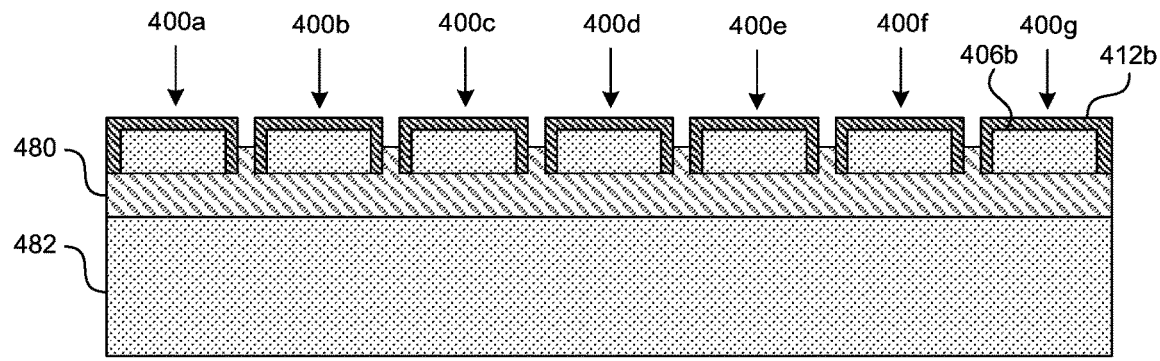

Referring next to FIG. 4J, the method further includes removing at least a portion of the adhesive 480 from between the dies 400, so that the upper surfaces of the adhesive 480 is recessed from the upper surfaces of the second insulating material 412b. This can involve using a cleaning process based on the chemistry of the adhesive 480, or any suitable process or technique known to those of skill in the art.

Figure 4K:
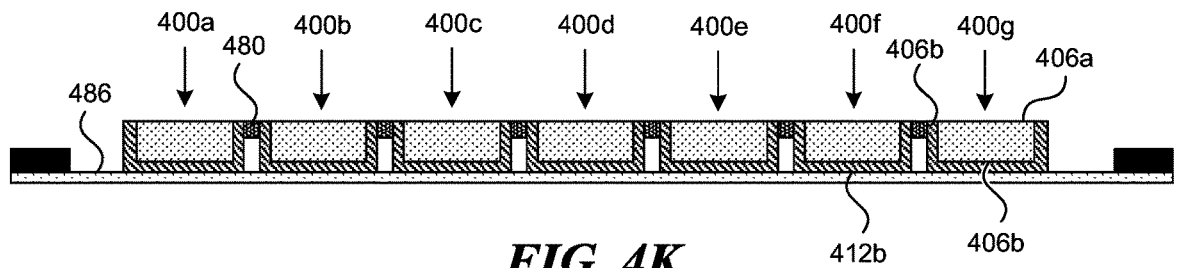

Referring next to FIG. 4K, the method further includes separating the dies 400 from the adhesive 480 and carrier substrate 482, and mounting the second insulating material 412b on the dies 400 on a second carrier substrate 486 (e.g., dicing tape or film mounted in a frame). The adhesive 480 and carrier substrate 482 can be removed using any suitable technique known to those of skill in the art. In the illustrated embodiment, the portions of the adhesive 480 between the dies 400 can remain after the dies 400 have been mounted on the second carrier substrate 486. In other embodiments, the adhesive 480 can be completely removed from between the dies 400 when the dies 400 are mounted to the second carrier substrate 486.

Figure 4L:
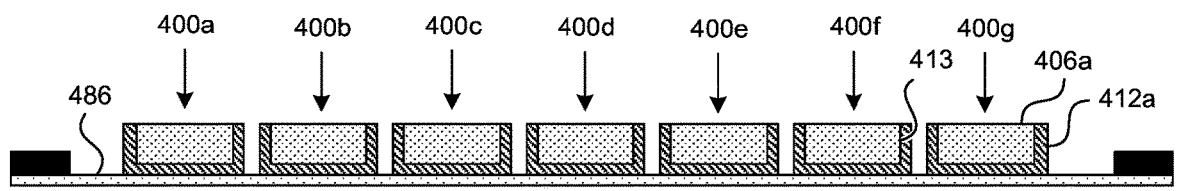

Referring next to FIG. 4L, the method further includes removing any remaining adhesive 480 (not shown) from between the dies 400. This can be accomplished using the same process as discussed previously with respect to FIG. 4J, or any suitable process or technique known to those of skill in the art. In the illustrated embodiment, the dies 400 can have lateral surfaces 413 at least partially covered by the first insulating material 412a (e.g., a lateral surface passivation material). In some embodiments, the dies 400 can be separated from the second carrier substrate 486 and used in the manufacture of semiconductor devices (e.g., the devices 100, 200, and/or 220 of FIGS. 1A-1B, 2A, and 2B, respectively) in accordance with embodiments of the present technology.

Figure 5:
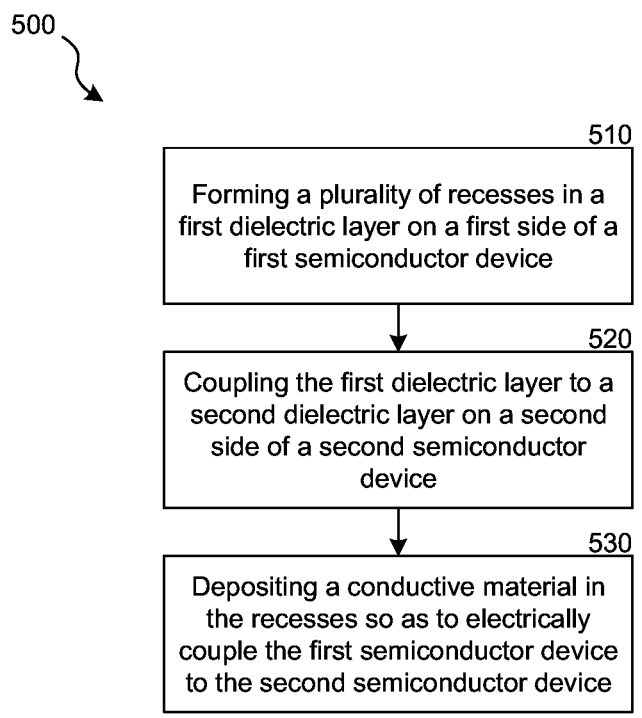
FIG. 5 is a block diagram illustrating a method of manufacturing a semiconductor assembly, in accordance with embodiments of the present technology.

FIG. 5 is a block diagram illustrating a method 500 of manufacturing a semiconductor assembly, in accordance with embodiments of the present technology. The method 500 can be used to manufacture any embodiment of the semiconductor assemblies described herein, and/or one or more components thereof (e.g., assembly 150 of FIGS. 1C-1D, assembly 250 of FIGS. 2C-2D).

At block 510, the method 500 can include forming a plurality of recesses in a first dielectric layer on a first side or surface of a first semiconductor device. The recesses can expose a plurality of metal structures at an edge (e.g., periphery, outer perimeter, etc.) on the first side of the first semiconductor device (e.g., as previously described with respect to FIGS. 1A, 2A, and 2B). In some embodiments, the plurality of metal structures are a plurality of first metal structures. The recesses can be formed, for example, using the processes described above with reference to FIGS. 3A-3D.

At block 520, the method 500 can further include coupling the first dielectric layer of the first semiconductor device to a second dielectric layer on a second side or surface of a second semiconductor device. In some embodiments, the first semiconductor device can be an upper device, the first side can be a lower side, the second semiconductor device can be a lower device, and the second side can be an upper side. The second side of the semiconductor device can include a plurality of conductive elements that can be aligned (e.g., vertically aligned) with the metal structures and the recesses of the first semiconductor device (e.g., as discussed previously with respect to FIGS. 1C-1D and FIGS. 2C-2D). In some embodiments, the plurality of conductive elements includes a plurality of second metal structures, and the second dielectric layer includes a plurality of recesses at least partially exposing the plurality of second metal structures (e.g., as previously described with respect to FIG. 1A). In other embodiments, the plurality of conductive elements includes a plurality of conductive protrusions extending from the second dielectric layer (e.g., as previously described with respect to FIGS. 2A and 2B). In such embodiments, coupling the first and second dielectric layers can include inserting the plurality of conductive protrusions of the second semiconductor device into the corresponding plurality of recesses of the first semiconductor device.

At block 530, the method 500 can further include depositing a conductive material in the recesses so as to electrically couple the metal structures of the first semiconductor device to the conductive elements of the second semiconductor device (e.g., as previously described with respect to FIGS. 1C, 1D, 2C, and 2D). As discussed above, the conductive material can form interconnect structures that electrically couple the first and second semiconductor devices to each other.

Figure 6:
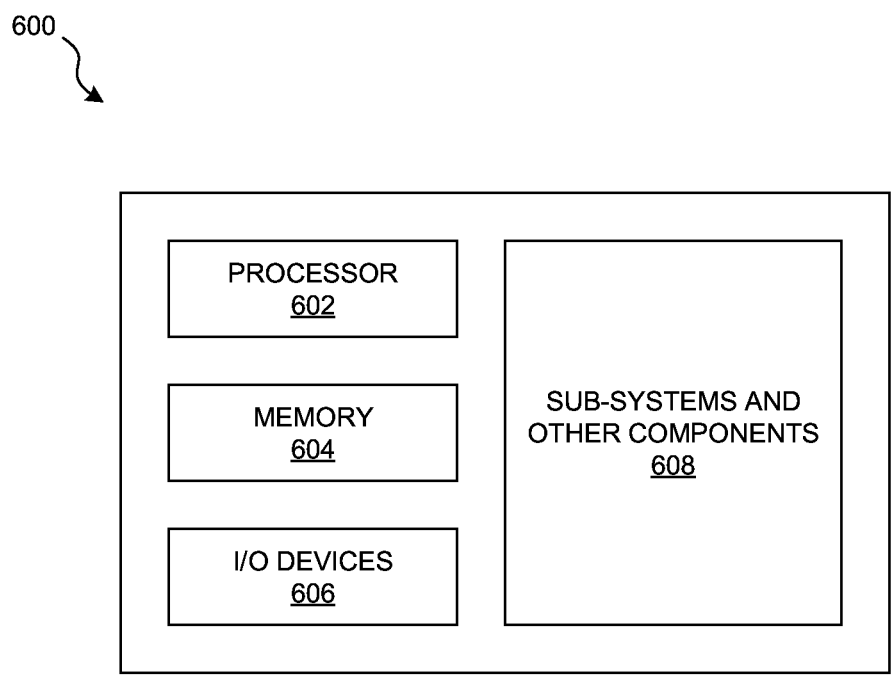
FIG. 6 is a schematic view of a system that includes a semiconductor device or assembly configured in accordance with embodiments of the present technology.

Any one of the semiconductor devices and/or assemblies having the features described above with reference to FIGS. 1A-5 can be incorporated into any of a myriad of larger and/or more complex systems, a representative example of which is system 600 shown schematically in FIG. 6. The system 600 can include a processor 602, a memory 604 (e.g., SRAM, DRAM, flash, and/or other memory devices), input/output devices 606, and/or other subsystems or components 608. The semiconductor devices and/or assemblies described above with reference to FIGS. 1A-5 can be included in any of the elements shown in FIG. 6. The resulting system 600 can be configured to perform any of a wide variety of suitable computing, processing, storage, sensing, imaging, and/or other functions. Accordingly, representative examples of the system 600 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 600 include lights, cameras, vehicles, etc. With regard to these and other examples, the system 600 can be housed in a single unit or distributed over multiple interconnected units, e.g., through a communication network. The components of the system 600 can accordingly include local and/or remote memory storage devices and any of a wide variety of suitable computer-readable media.

From the foregoing, it will be appreciated that specific embodiments of the invention have been described herein for purposes of illustration, but that various modifications may be made without deviating from the scope of the invention. Accordingly, the invention is not limited except as by the appended claims.

We claim:

1. A semiconductor assembly comprising:
   a first semiconductor device including:
     an upper surface including a plurality of first metal structures at a first lateral edge of the upper surface, and
     a first dielectric layer over the upper surface, the first dielectric layer including a plurality of first recesses extending inward from the first lateral edge, the plurality of first recesses at least partially exposing the first metal structures;
   a second semiconductor device mounted on the first semiconductor device, the second semiconductor device including:
     a lower surface including a plurality of second metal structures at a second lateral edge of the lower surface, wherein each second metal structure is aligned with a corresponding first metal structure of the first semiconductor device, and
     a second dielectric layer over the lower surface, the second dielectric layer including a plurality of second recesses extending inward from the second lateral edge, the plurality of second recesses at least partially exposing the second metal structures, wherein the second dielectric layer is bonded to the first dielectric layer of the first semiconductor device; and
   a plurality of plated structures positioned within the first and second recesses, wherein each plated structure electrically couples a first metal structure of the first semiconductor device to a corresponding second metal structure of the second semiconductor device.

2. The semiconductor assembly of claim 1, wherein:
   each first recess and corresponding second recess collectively form a gap,
   the corresponding first and second metal structures exposed by the first and second recesses, respectively, are spaced apart from each other by the gap, and
   the corresponding plated structure electrically coupling the first and second metal structures bridges the gap.

3. The semiconductor assembly of claim 1, further comprising a passivation material over one or more lateral surfaces of the first and second semiconductor devices.

4. The semiconductor assembly of claim 1 wherein an exposed portion of each of the first and second metal structures has a rectangular shape.

5. The semiconductor assembly of claim 1 wherein the plurality of first and second recesses each has a height within a range from 200 nm to 2 μm and a depth less than or equal to 25 μm.

6. The semiconductor assembly of claim 1 wherein each plated structure comprises copper.

7. The semiconductor assembly of claim 1 wherein each plated structure does not extend past the first and second lateral edges.

8. The semiconductor assembly of claim 1 wherein the first recesses and the second recesses extend inward by a same amount.

9. The semiconductor assembly of claim 1 wherein the first and second dielectric layers each include at least one of silicon oxide, silicon nitride, poly-silicon nitride, poly-silicon oxide, and tetraethyl orthosilicate (TEOS).

10. A semiconductor assembly comprising:
    a first semiconductor device including:
      an upper surface including a plurality of metal structures at a first lateral edge of the upper surface, and
      a first dielectric layer over the upper surface, the first dielectric layer including a plurality of recesses extending inward from the first lateral edge, the plurality of recesses at least partially exposing the metal structures;
    a second semiconductor device mounted on the first semiconductor device, the second semiconductor device including:
      a lower surface including a second dielectric layer, wherein the second dielectric layer is bonded to the first dielectric layer of the first semiconductor device, and
      a plurality of conductive protrusions at a second lateral edge of the lower surface, the plurality of conductive protrusions extending from the second dielectric layer, wherein each conductive protrusion is aligned with a corresponding metal structure of the first semiconductor device; and
    a plurality of plated structures positioned within the recesses, wherein each plated structure electrically couples a metal structure of the first semiconductor device to a conductive protrusion of the second semiconductor device.

11. The semiconductor assembly of claim 10, wherein the first dielectric layer includes a plurality of first bevels, each first bevel near a corresponding recess.

12. The semiconductor assembly of claim 11 wherein each metal structure includes a metal structure bevel aligned with a corresponding first bevel in the first dielectric layer.

13. The semiconductor assembly of claim 11, wherein the second dielectric layer includes a plurality of second bevels, each second bevel near a corresponding conductive protrusion.

14. The semiconductor assembly of claim 13 wherein:
    each first bevel is vertically aligned with a corresponding second bevel, and each first bevel is configured to receive a corresponding second bevel.

15. The semiconductor assembly of claim 10 wherein each recess is configured to receive a corresponding conductive protrusion.

16. The semiconductor assembly of claim 15 wherein each recess has a shape complementary to the corresponding conductive protrusion.

17. The semiconductor assembly of claim 10, wherein the plurality of conductive protrusions each include a first portion formed from a first conductive material, and a second portion formed from the second dielectric material layer.

18. A method for manufacturing a semiconductor assembly, the method comprising:
   forming a plurality of recesses in a first dielectric layer on a first side of a first semiconductor device, wherein the semiconductor device includes a plurality of metal structures at a first lateral edge of the first side that are at least partially exposed by the recesses;
   coupling the first dielectric layer of the first semiconductor device to a second dielectric layer on a second side of a second semiconductor device, wherein the second side of the semiconductor device includes a plurality of conductive elements aligned with the metal structures and the recesses of the first semiconductor device; and
   plating a conductive material in the recesses so as to electrically couple the metal structures of the first semiconductor device to the conductive elements of the second semiconductor device.

19. The method of claim 18 wherein:
   the plurality of metal structures are a plurality of first metal structures;
   the plurality of conductive elements includes a plurality of second metal structures; and
   the second dielectric layer includes a plurality of second recesses at least partially exposing the second metal structures.

20. The method of claim 18 wherein the plurality of conductive elements includes a plurality of conductive protrusions extending from the second dielectric layer.

21. The method of claim 20 wherein coupling the first and second dielectric layers further includes inserting the plurality of conductive protrusions of the second semiconductor device into the corresponding plurality of recesses of the first semiconductor device.

22. The method of claim 18 wherein the conductive material comprises copper deposited in the recesses by electroless plating.

* * * * *